US012650463B2

(12) United States Patent
Kraemer et al.

(10) Patent No.: US 12,650,463 B2
(45) Date of Patent: Jun. 9, 2026

(54) BREAKOUT CONNECTOR PLATFORM FOR INTERPOSER MODULES THAT IMPLEMENT DENSELY PITCHED INTEGRATED CIRCUITS ON CONVENTIONAL MOTHERBOARDS

(71) Applicant: BAE SYSTEMS Information and Electronic Systems Integration Inc., Nashua, NH (US)

(72) Inventors: Andrew M. Kraemer, Manchester, NH (US); Nicholas L. Campbell, Nashua, NH (US); Kevin S. Bassett, Nottingham, NH (US); Peter DiSalvo, Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 384 days.

(21) Appl. No.: 18/524,667

(22) Filed: Nov. 30, 2023

(65) Prior Publication Data

US 2025/0180639 A1 Jun. 5, 2025

(51) Int. Cl.
| | |
|---|---|
| *G01R 31/28* | (2006.01) |
| *H01R 12/70* | (2011.01) |
| *H01R 12/71* | (2011.01) |

(52) U.S. Cl.
CPC ..... *G01R 31/2889* (2013.01); *H01R 12/7076* (2013.01); *H01R 12/716* (2013.01)

(58) Field of Classification Search
CPC .............. G01R 31/2889; H01R 12/716; H01R 12/7076; H01R 12/75; H01R 43/26; H10W 70/65; H10W 72/072; H10W 90/724
See application file for complete search history.

(56) References Cited

U.S. PATENT DOCUMENTS

| | | | |
|---|---|---|---|
| 6,058,022 A | 5/2000 | Gianni |
| 6,462,570 B1 | 10/2002 | Price |
| 6,608,379 B2 | 8/2003 | Yeo |
| 6,870,273 B2 | 3/2005 | Tao |

(Continued)

FOREIGN PATENT DOCUMENTS

WO 2002067325 A2 8/2002

*Primary Examiner* — Eman A Alkafawi
*Assistant Examiner* — Suresh K Rajaputra
(74) *Attorney, Agent, or Firm* — Maine Cernota & Curran

(57) ABSTRACT

A breakout connector platform (BCP) increases the number of signals that can be exchanged with a densely pitched integrated circuit (DP-chip), such as a flip-chip, attached to an interposer module. The BCP is connected with the interposer module via mezzanine connectors, and includes breakout connectors and other connectors required for testing and operation of the DP-chip, including power, ground, and/or clock connectors. Mezzanine connections are arranged so that clusters of power connections, clusters of differential pairs of high frequency connections, and clusters of lower frequency control connections and/or differential pairs of clock connections are surrounded by ground connections. High frequency traces on the BCP are arranged as differential pairs. A plurality of interposer modules can be supported by the BCP. The interposer module can also include breakout connectors and/or a cover with cooling fan. Secondary mezzanine connectors can enable mounting of the BCP to an underlying motherboard.

20 Claims, 20 Drawing Sheets

(56) References Cited

U.S. PATENT DOCUMENTS

| | | | |
|---|---|---|---|
| 7,110,227 B2 | 9/2006 | Anthony | |
| 7,709,943 B2 | 5/2010 | Michaels | |
| 8,363,418 B2 | 1/2013 | Johnson | |
| 9,651,751 B1 | 5/2017 | Ding | |
| 11,546,991 B2 | 1/2023 | Salmon | |
| 2003/0132529 A1 | 7/2003 | Yeo | |
| 2004/0266224 A1* | 12/2004 | Watson | H01R 13/6477 |
| | | | 439/66 |
| 2018/0316082 A1* | 11/2018 | Keller, III | H01Q 1/38 |
| 2020/0006836 A1* | 1/2020 | Hu | H05K 1/115 |
| 2025/0183571 A1* | 6/2025 | Kraemer | H01R 12/716 |

* cited by examiner 118
interconnection points 120
die

132

120

101

124

120

118

130
interconnection point array

BREAKOUT CONNECTOR PLATFORM FOR INTERPOSER MODULES THAT IMPLEMENT DENSELY PITCHED INTEGRATED CIRCUITS ON CONVENTIONAL MOTHERBOARDS

RELATED APPLICATIONS

This application is related to U.S. patent application Ser. No. 18/524,300, filed concurrently with this application, which is herein incorporated by reference in its entirety for all purposes.

FIELD

The disclosure relates to circuit assemblies, and more particularly, to circuit assemblies that require monitoring of a large number of interconnections to at least one densely pitched integrated circuit, such as a flip-chip.

BACKGROUND

For applications where it is important to minimize the size and weight of electronic systems, integrated circuits must be made as small as possible. This requires that the connection points on the integrated circuit be closely spaced together, i.e. "densely pitched." Indeed, densely pitched integrated circuits with advanced packaging can measure 8 mm by 10 mm having approximately 1000 electrical interconnection points spaced apart by a pitch of less than 250 microns. As the equipment and technology improves, fine pitches well under 100 microns are being implemented. As used herein, the terms "densely pitched" (DP), "finely pitched" (FP) and "fine pitch" (FP) refer to a pitch of less than 250 microns.

Unfortunately, mounting a fine pitch chip directly to a motherboard can be problematic, in part because warping and other variances in the fabrication and assembly process can easily occur on large circuit cards, causing the connections to be unreliable, in part because the flexibility of the motherboard can cause the connections to fail even after they are established, and in part because it can be difficult to provide motherboard traces that are sufficiently narrow to establish contact with all of the closely pitched connections of a densely pitched integrated circuit.

As with most integrated circuits, prototype testing of new flip-chip and other DP-chip designs is essential before they are produced in quantity. However, for any given application, it may not be convenient, or it may be impossible, to monitor and test all relevant signals that are directed to and from the DP-chip.

What is needed, therefore, is an apparatus that enables monitoring of a large number of high frequency signals during prototype testing of a DP-chip, without requiring specialized, high frequency shielded interconnections and connectors on a motherboard.

SUMMARY

Accordingly, the present disclosure is an apparatus that enables prototype testing of an integrated circuit, such as a densely pitched integrated circuit (DP-chip) having a large number of high frequency signals to be monitored, without requiring specialized, high frequency shielded interconnections and connectors on a motherboard. The DP-chip in one example is a flip-chip transceiver module.

In a first general aspect the disclosed apparatus includes a breakout connector platform (BCP) for direct signal intercommunication with an integrated circuit via an interposer module. The BCP includes a BCP circuit card having at least one BCP breakout connector installed thereupon, at least one BCP mezzanine connector extending from an upper surface of the BCP circuit card, where each of the BCP mezzanine connectors comprises a plurality of BCP mezzanine connections, and where the BCP mezzanine connections including a plurality of BCP mezzanine ground connections, at least one BCP mezzanine power connection, and at least one BCP AC connection.

The apparatus further includes a plurality of BCP interconnections comprising a plurality of BCP ground interconnections interconnecting between the plurality of BCP mezzanine ground connections and at least one ground input of the BCP circuit card, at least one BCP power interconnection interconnecting between the at least one BCP mezzanine power connection and at least one power input to the BCP circuit card, and at least one BCP AC interconnection interconnecting between the at least one BCP mezzanine AC connection and the at least one BCP breakout connector.

In a second general aspect, the disclosed apparatus includes a first interposer module and a breakout connector platform (BCP). The interposer module includes an interposer circuit card having an interconnection array of connection pads on an upper surface thereof, the interconnection array comprising a plurality of ground connection pads, at least one power connection pad, and a plurality of AC connection pads. At least one interposer mezzanine connector extends from a lower surface of the interposer circuit card, each of the interposer mezzanine connectors comprising a plurality of interposer mezzanine connections. The interposer module further includes a plurality of interposer interconnections between the connection pads of the interconnection array and the interposer mezzanine connections.

The interposer mezzanine connections include a plurality of interposer mezzanine ground connections interconnected by the interposer interconnections with the plurality of ground connection pads, at least one interposer mezzanine power connection interconnected by the interposer interconnections with the at least one power connection pad, and a plurality of interposer mezzanine AC connections interconnected by the interposer interconnections with the plurality of AC connection pads.

The breakout connector platform (BCP) includes a BCP circuit card having at least one BCP breakout connector installed thereupon, and at least one BCP mezzanine connector extending from an upper surface of the BCP circuit card, and compatible for mating with the at least one interposer mezzanine connector. Each of the BCP mezzanine connectors includes a plurality of BCP mezzanine connections, including a plurality of BCP mezzanine ground connections configured for interconnection with the plurality of interposer mezzanine ground connections, at least one BCP mezzanine power connection configured for interconnection with the at least one interposer mezzanine power connection, and a plurality of BCP mezzanine AC connections configured for interconnection with the plurality of interposer mezzanine AC connections.

The BCP further includes a plurality of BCP interconnections comprising a plurality of BCP ground interconnections interconnecting between the plurality of BCP mezzanine ground connections and at least one ground input of the BCP circuit card, at least one BCP power interconnection interconnecting between the at least one BCP mezzanine power connection and at least one power input to the BCP circuit card, and at least one BCP AC interconnection interconnecting between at least one of the plurality of BCP mezzanine AC connections and the at least one BCP breakout connector.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Embodiments of the present disclosure are directed to an apparatus and method for incorporating a densely pitched integrated circuit ("DP-chip") into a motherboard circuit assembly, without placing undue requirements on the motherboard, and while substantially eliminating crosstalk between traces.

One approach to making integrated circuits as small as possible is to implement "chip-scale" packaging (CSP), where the package is no larger than the die itself. According to this approach, with reference to FIGS. 1A and 1B, very small "bumps" of solder are formed as interconnection points 118 on the tops of the dies 120 during the final wafer processing step, before the individual dies 120 are cut from the wafer. This is sometimes referred to as "wafer level packaging" or "WLP," where the "packaging" refers here to the bumps that are applied as interconnection points 118 to the dies. The interconnection points 118 are not limited to only the periphery of the die 120, but can be provided as an interconnection point array 130 of a plurality of interconnection points 118 that takes advantage of most of the footprint of the die 120.

Figures 1A, 1B, 1C:
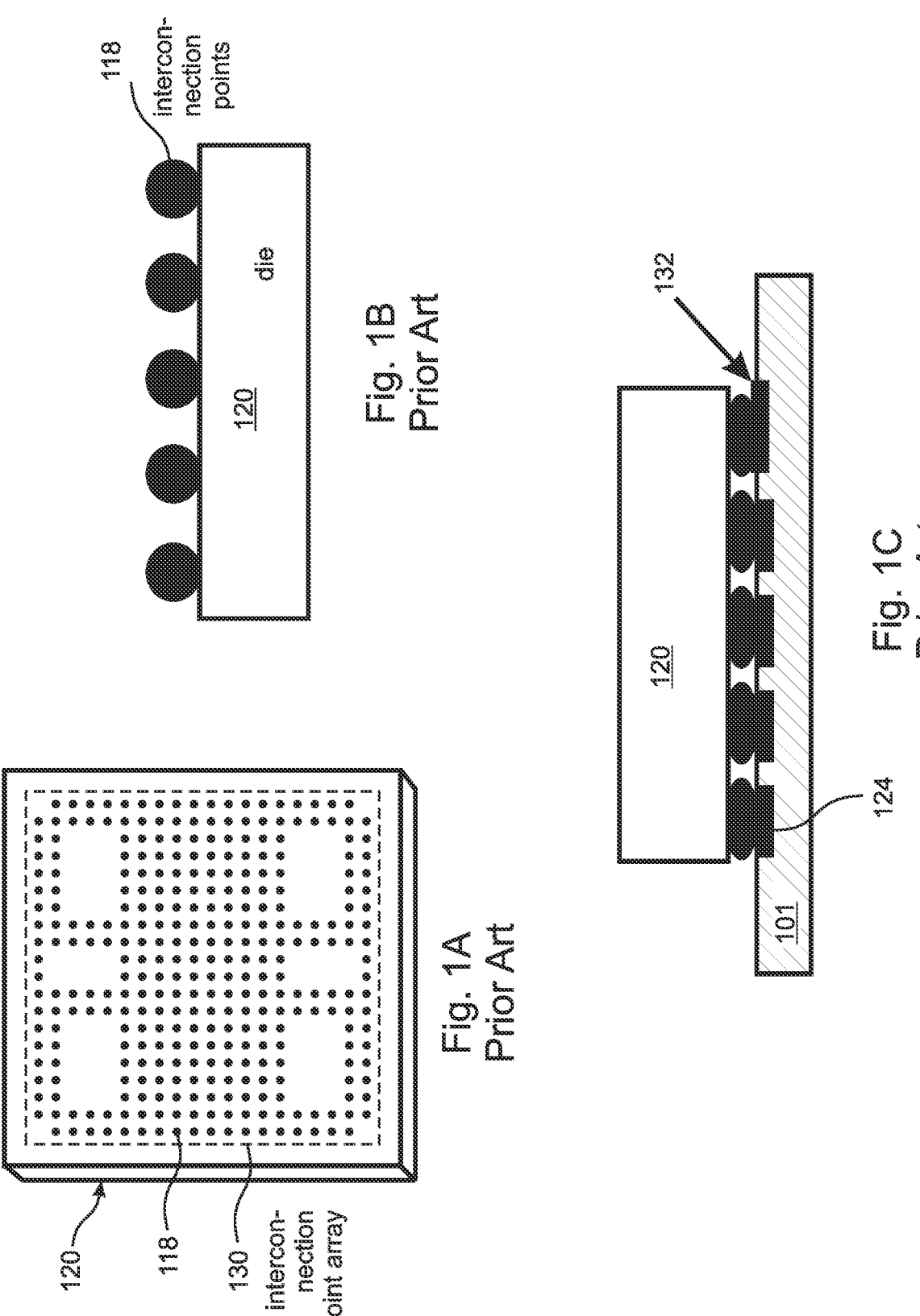
FIG. 1A is a perspective view from above of a flip-chip interconnection point array of a flip-chip of the prior art.
FIG. 1B is a side view of a flip-chip of the prior art.
FIG. 1C is a side view illustrating interconnection of a flip-chip die with the motherboard of a circuit assembly of the prior art.

After the dies 120 are cut from the wafer, each of the dies 120 is "flipped" so that its interconnection points 118 are facing downward. With reference to FIG. 1C, the die 120 is then positioned so that its interconnection points 118 are aligned with a corresponding array 132 of solder bump connection pads 124 provided on a motherboard 101. The solder bumps on the interconnection points 118 are then re-flowed by any of several known heating methods, such that all of the required interconnections to the motherboard 101 are formed simultaneously.

Devices of this type, i.e. dies 120 to which "bumps" have been applied as interconnection points 118, e.g. for wave soldering, are frequently referred to in the industry as "flip-chips." The term "flip-chip" is also frequently used in the industry to refer to the WLP CSP manufacturing process, and/or to the method of attaching such devices to external circuitry (e.g. motherboards 101). However, it will be understood that the term "flip-chip" is used herein exclusively to refer to the device itself, and not to its method of manufacture, nor to the method of interconnecting the device with motherboards, or with other external circuitry.

In general, the interconnection points 118 of a flip-chip can include both "DC" and "AC" interconnection points, where the "DC" interconnection points include ground interconnection points as well as other fixed voltage interconnection points that remain substantially constant in voltage, referred to herein generically as "power" interconnection points. The "AC" interconnection points carry either analog or digital signals that vary in voltage with time according to a sinusoidal frequency (analog) or chip rate (digital), where both are referred to generically herein as the "frequency" of the signals. As used herein, the "AC" signals include RF signals as well as AC power or control signals. The AC interconnection points can be characterized according to their frequency range, with "low frequency" interconnection points being configured to carry "low frequency" signals, referred to generically herein as "control" signals, having frequencies below 1 MHZ, "mid-frequency" interconnection points being configured to carry "mid-frequency" signals, referred to generically herein as "clock" signals, having frequencies from 1 MHz to 50 MHZ, and "high-frequency" interconnection points being configured to carry "high frequency" signals having frequencies above 50 MHz. Note that, according to these definitions, an AC voltage that oscillates, for example at 50 Hz or 60 Hz, falls into the "control signal" category, even though it may be intended to provide power to the flip-chip. The locations of the power, signal, and ground interconnection points are arranged to provide optimal signal integrity and performance.

Exemplary embodiments of the present disclosure are described herein with reference to a densely pitched "flip-chip." However, it will be understood that the scope of the present disclosure extends to monitoring of high frequency signals during prototype testing of any unpackaged integrated circuit. Accordingly, references herein to a "flip-chip" will be understood to refer to any unpackaged integrated circuit, unless otherwise stated or required by context.

Figure 2A:
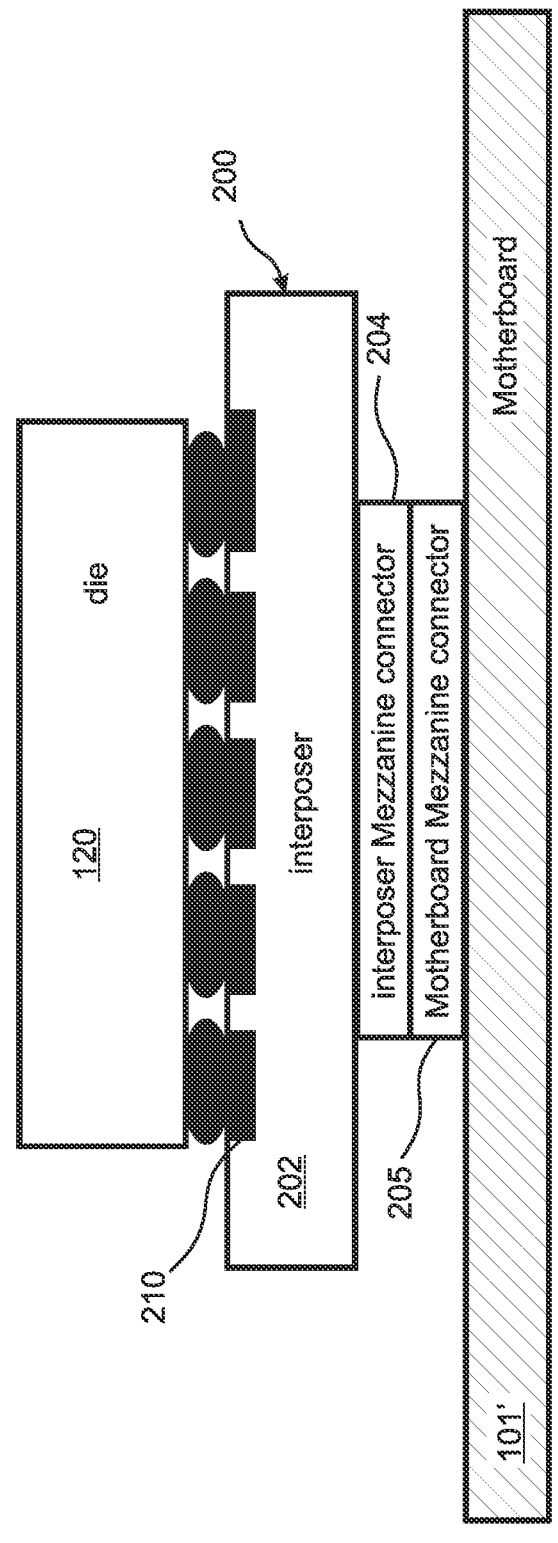
FIG. 2A is aside view of an interposer module interconnected with an underlying motherboard in an embodiment of the present disclosure.
Figure 2B:
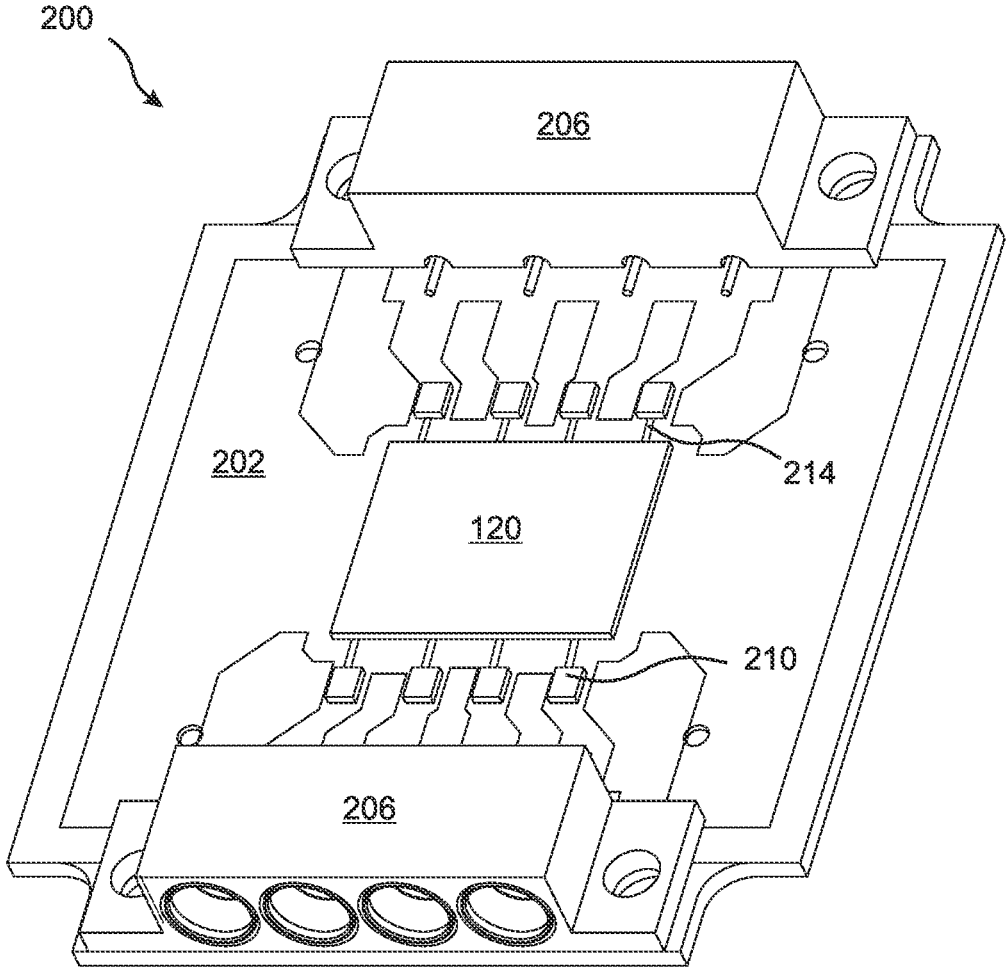
FIG. 2B is a perspective view from above, drawn to scale, of an interposer module in a BCP kit embodiment of the present disclosure.
Figure 2C:
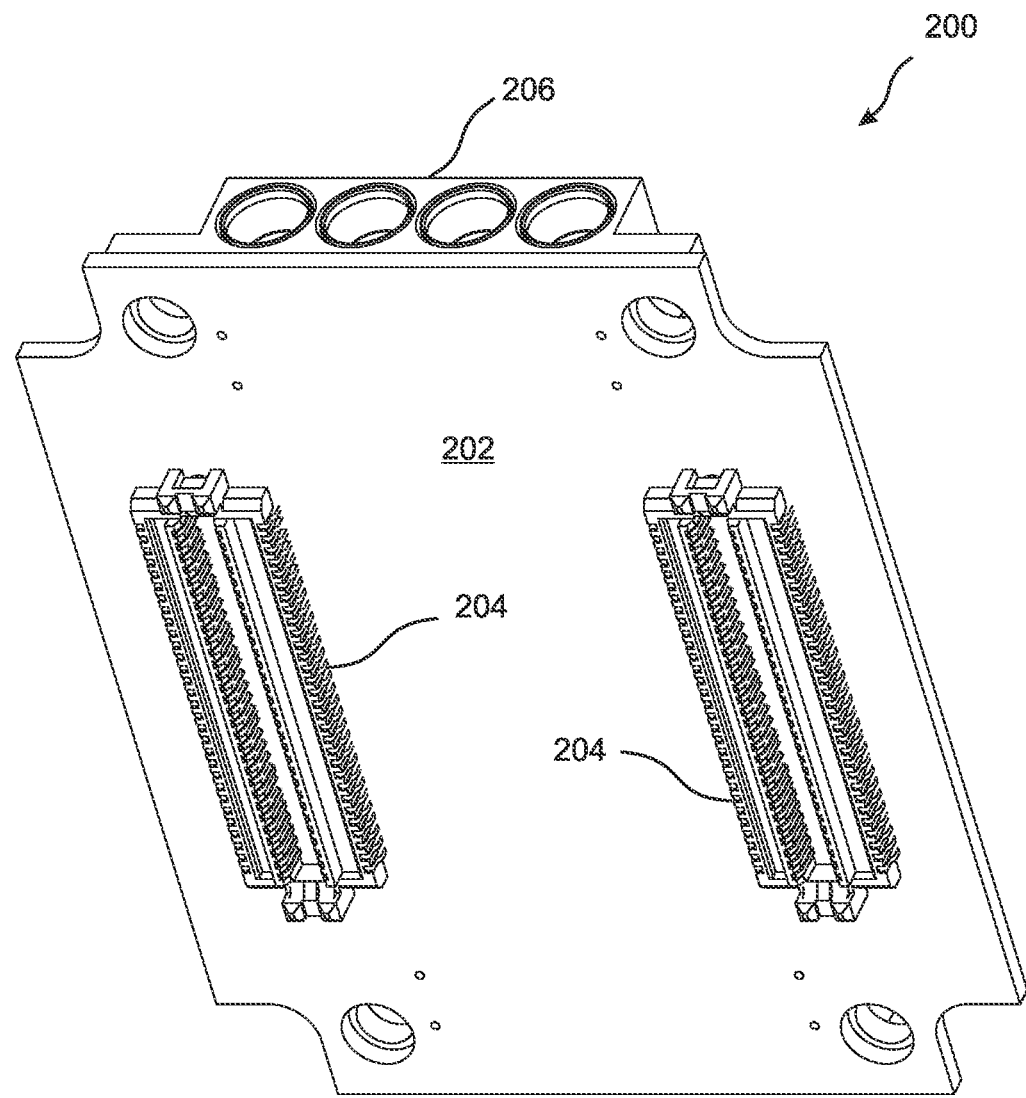
FIG. 2C is a perspective view from below, drawn to scale, of the interposer module of FIG. 2B.

With reference to FIGS. 2A through 2C, rather than mounting a DP-chip directly to a motherboard, another approach is to install the DP-chip on a relatively small intermediate card, referred to herein as an interposer module 200, which includes an interposer circuit card 202 that satisfies the enhanced requirements of a DP-chip 120 and can be removably installed on an underlying motherboard 101' using robust interposer mezzanine connectors 204 and compatible motherboard mezzanine connectors 205. Details regarding this interposer module approach are disclosed in U.S. patent application Ser. No. 18/524,300, also by the present Applicant and filed concurrently with the present disclosure, which is incorporated herein by reference in its entirety for all purposes.

Some interposer modules 200 further include one or more interposer "breakout" connectors 206 that are coupled through the interposer circuit card 202 by signal traces 214 and/or vias to the connection pads of the DP-chip interconnection array 210. In the illustrated embodiment, the breakout connectors 206 are high frequency GPPO® connectors. (GPPO® is a registered trademark of Corning Gilbert Inc.).

The present disclosure is an apparatus that enables monitoring of a large number of signals, including high frequency signals, during prototype testing of a DP-chip 120, without requiring specialized, high frequency shielded interconnections and connectors on a motherboard 101', even when the number of signals to be monitored exceeds the number of breakout connectors 206 that can be provided on an interposer module 200

Figure 3A:
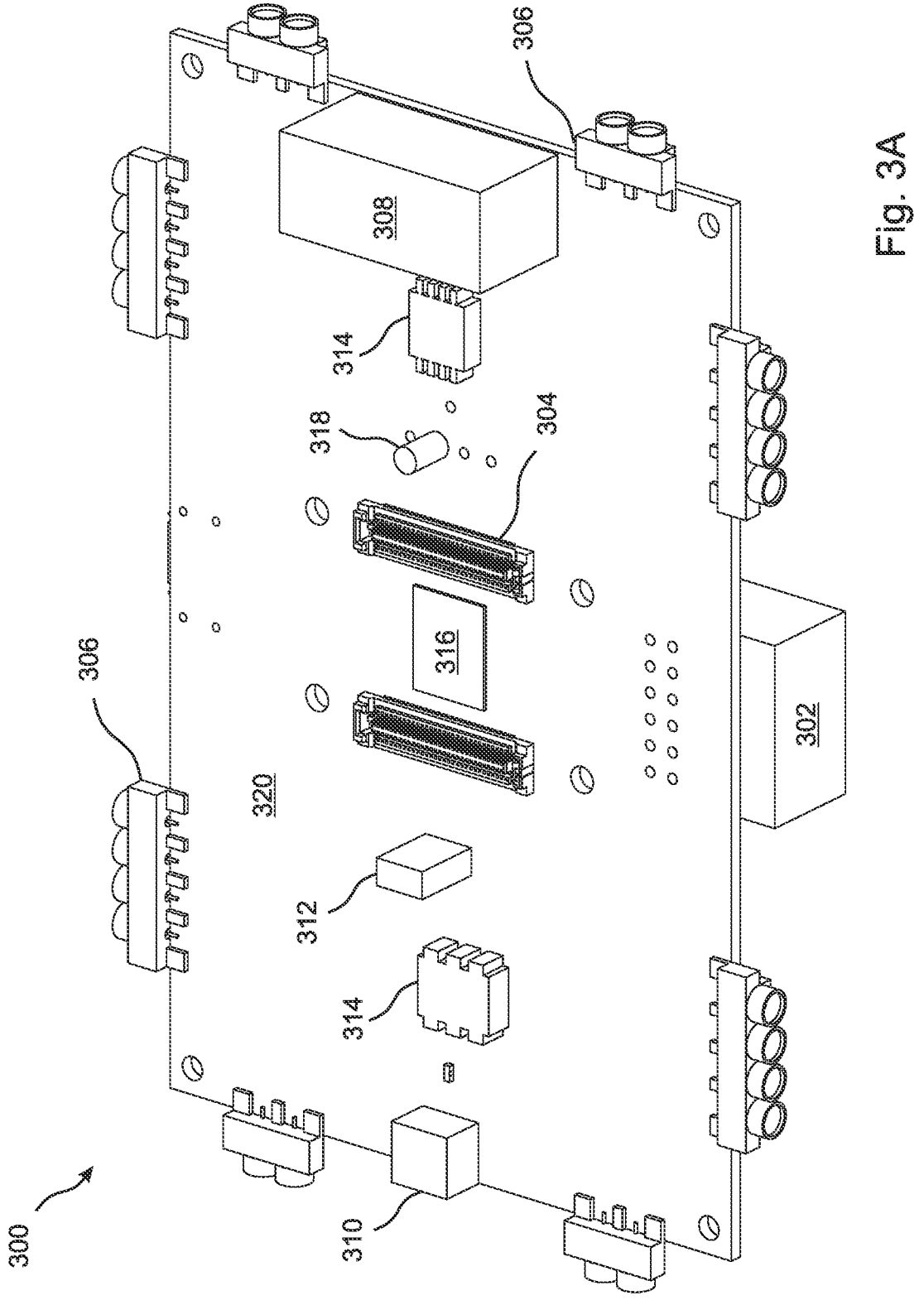
FIG. 3A is a perspective view from above, drawn to scale, of a breakout connector platform (BCP) in an embodiment of the present disclosure.
Figure 3B:
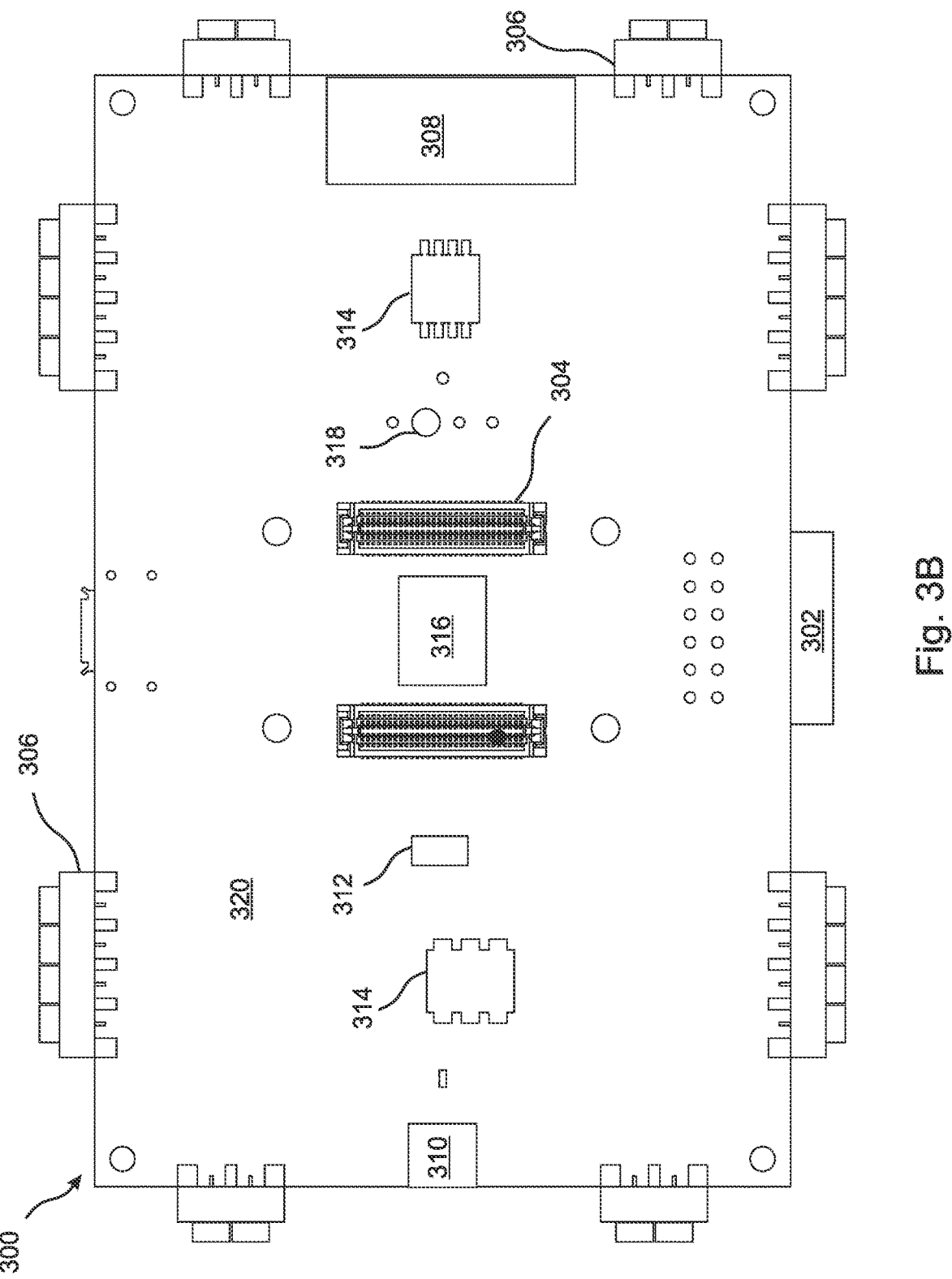
FIG. 3B is a top view, drawn to scale, of the BCP of FIG. 3A.
Figure 3C:
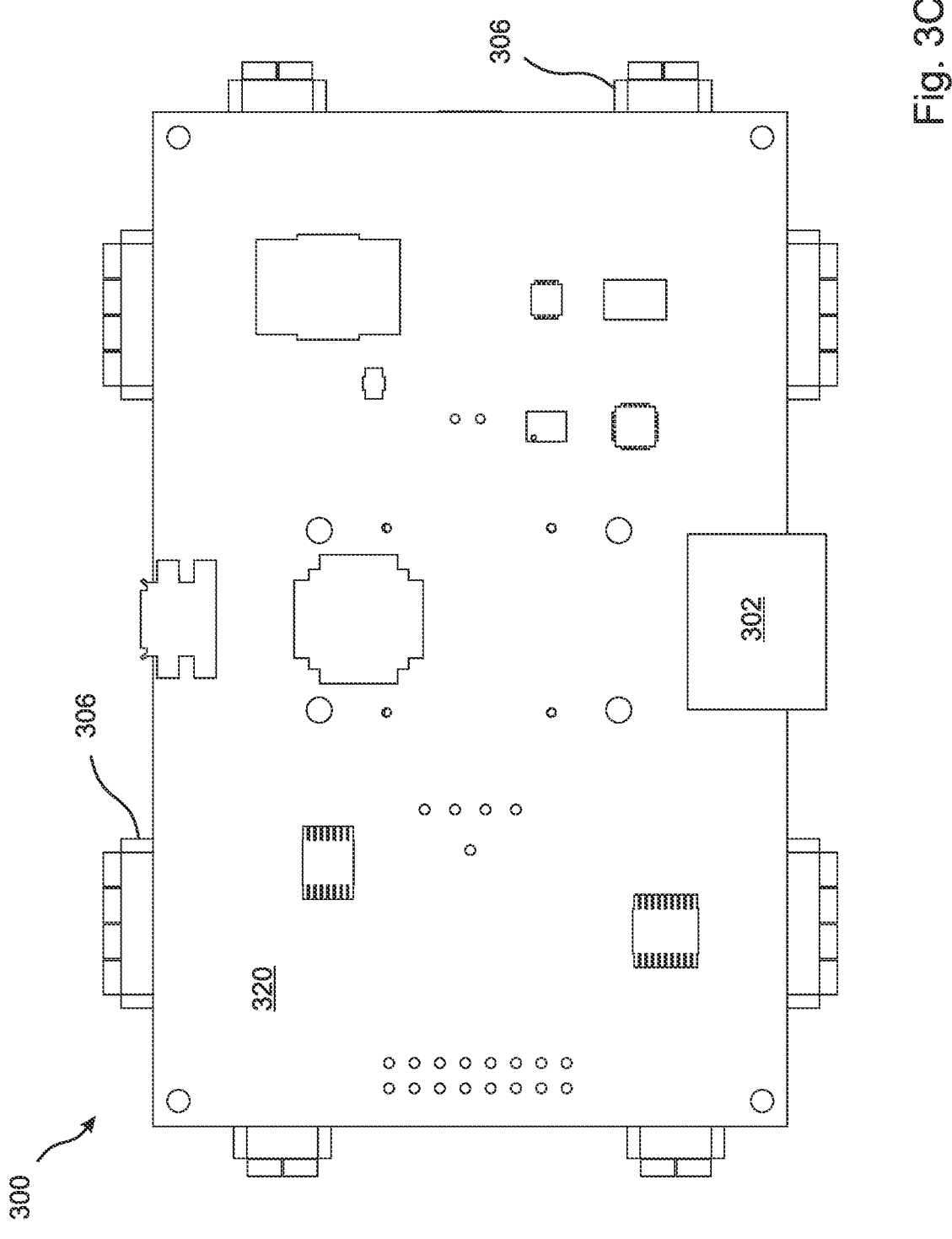
FIG. 3C is a bottom view from below, drawn to scale, of the BCP of FIG. 3A.

With reference to FIGS. 3B-3C, one embodiment of the present disclosure is a breakout connector platform ("BCP") 300 that includes a multilayer BCP circuit card 320 with BCP mezzanine connectors 304 configured for attachment thereto of interposer mezzanine connectors 204, as well as BCP breakout connectors 306 that extend the total number of breakout connectors 206, 306 included in the combined interposer module 200 and BCP 300. The interposer breakout connectors 206 and/or the BCP breakout connectors 306 can be GPPO® connectors. Another embodiment of the present disclosure is a breakout connector platform kit (BCP kit) that includes a BCP 300 as well as an interposer module 200. In some embodiments, the BCP kit further includes a DP-chip 120, such as a flip-chip, mounted to the interposer module 200.

In embodiments, the interposer breakout connectors 206, which are physically closer to the DP-chip 120, are able to communicate signals at higher frequencies, such as up to 40 GHz, while the BCP breakout connectors 306, which are physically further from the DP-chip 120, are used to communicate relatively lower frequency signals, such as up to 10 GH.

Figure 4:
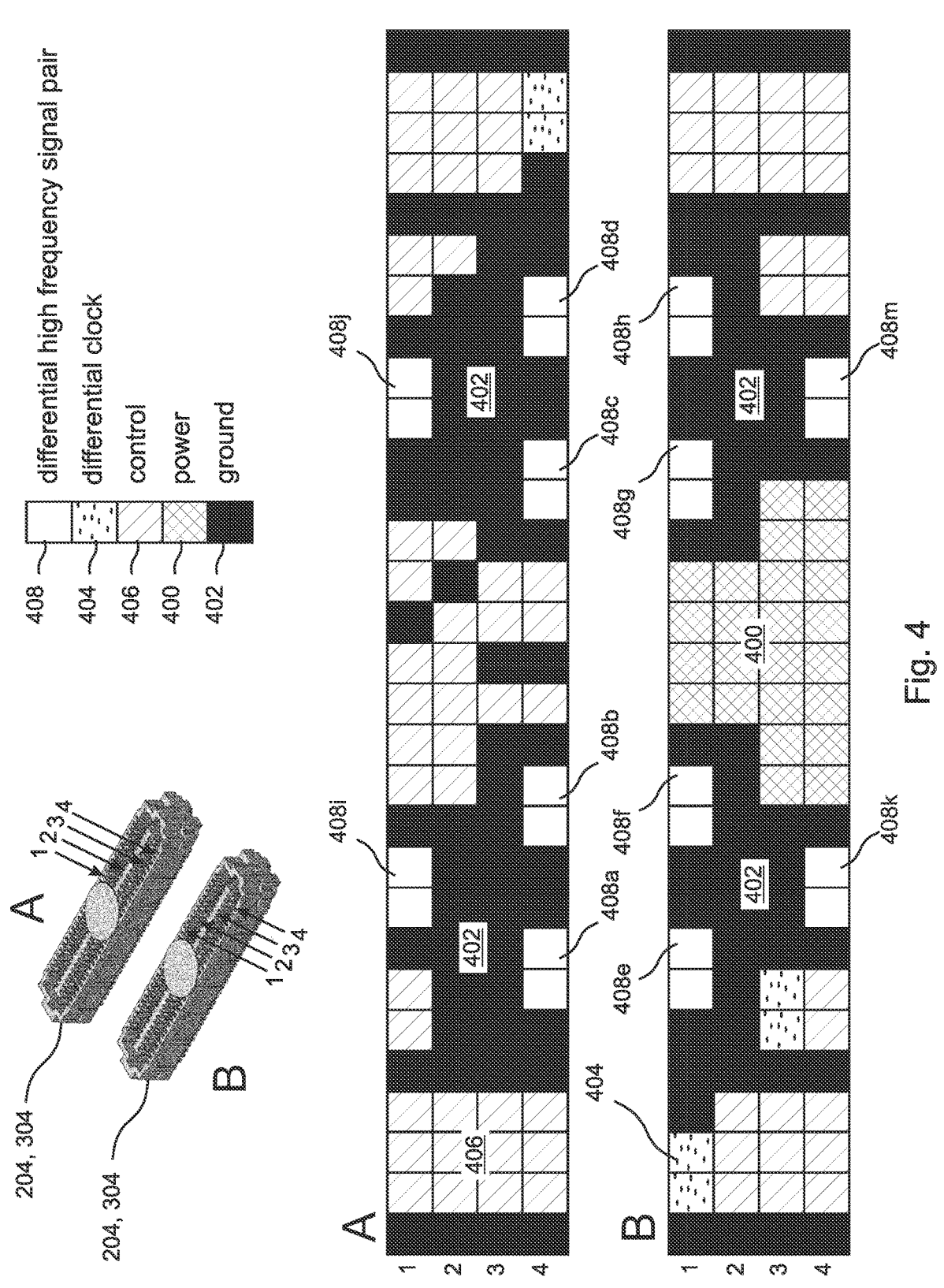
FIG. 4 is a chart illustrating the arrangement of the mezzanine connections in the embodiment of FIG. 3A.

With reference to FIG. 4, signal interference between the contacts of the mezzanine connectors 204, 304 and between the traces that interconnect the DP-chip 120 with the interposer mezzanine connectors 204 and the BCP mezzanine connectors 304 with the BCP breakout connectors 306, is minimized by assigning signals from the DP-chip 120 according to the following rules:

a. all of the mezzanine power connections and power traces are grouped together in a single DC cluster 400, which is entirely surrounded by ground mezzanine connections 402 and ground traces that isolate the DC cluster 400 and prevent AC signals from cross-contaminating the DC power lines and being thereby distributed throughout the motherboard, as well as preventing any "noise" that may be on the power lines from cross-contaminating the AC signals;

b. all of the clock mezzanine connections and clock traces are arranged in differential pairs of conductors 404 that are configured to carry signals which are equal in magnitude, but opposite in polarity;

c. all of the low frequency "control" mezzanine connections and control traces are grouped in low frequency clusters 406 that only contain control signals, and possibly also clock differential pairs 404, each of the low frequency clusters 406 being entirely surrounded and isolated by mezzanine ground connections 402 and ground traces; and d. all high frequency signal mezzanine connections and high frequency traces are provided as physically isolated differential pairs 408 that are surrounded by mezzanine ground connections 402 and ground traces.

Figure 5:
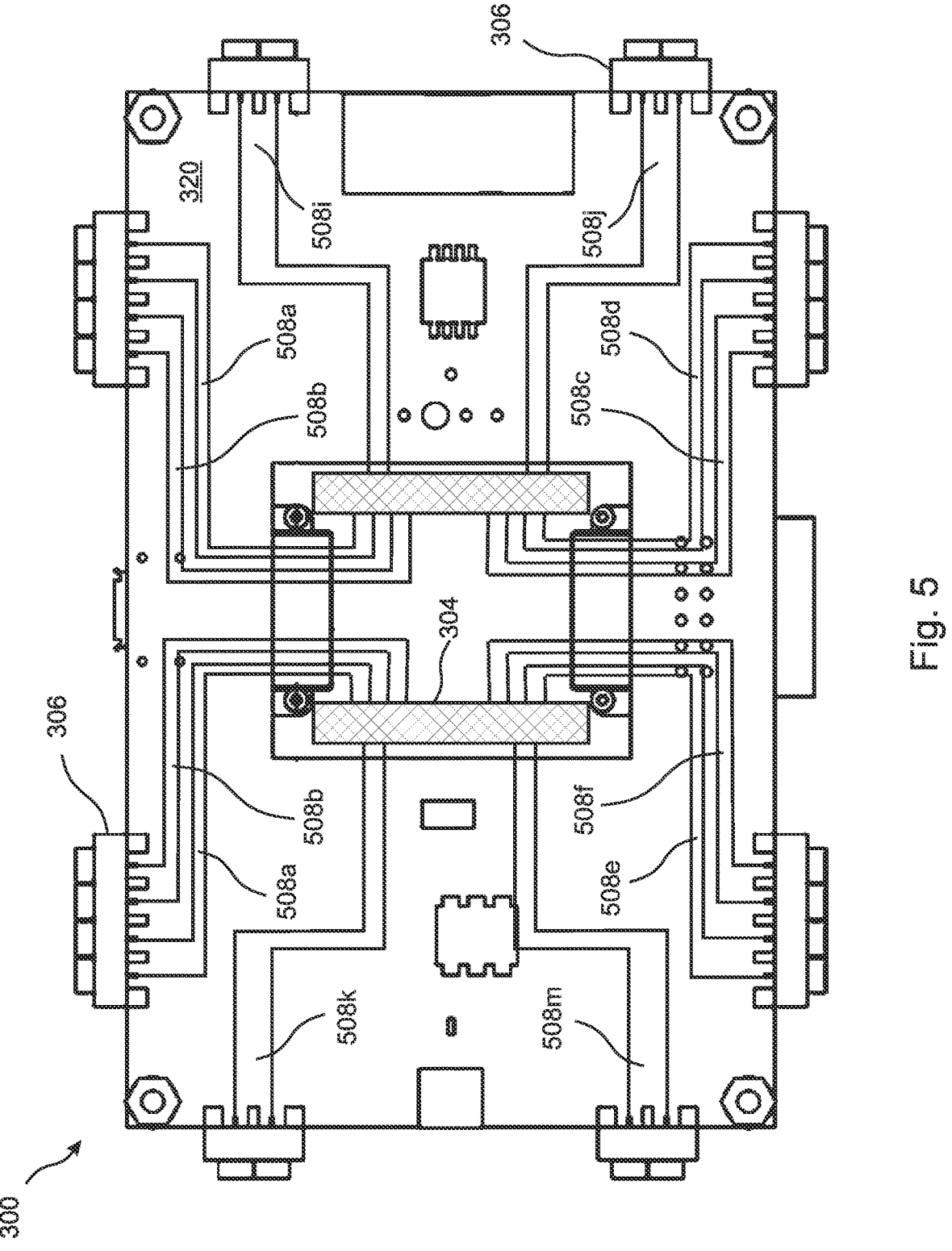
FIG. 5 is a top view of the embodiment of FIG. 3B showing the arrangement of the high frequency signal traces on the circuit card of the BCP.

With reference to FIG. 5, the differential pairing of the high frequency signals that interconnect between the BCP mezzanine connectors 304 and the BCP breakout connectors 306 is maintained by the traces on the breakout connector platform 300. It can be seen in the drawing that the differential trace pairs 508a-508m, which extend from the BCP mezzanine high frequency signal connections 408a-408m, as illustrated in FIG. 4, are routed as differential pairs from the BCP mezzanine connectors 304 to corresponding pairs of the BCP breakout connectors 306, without any need for them to be separated or to cross over each other.

With reference again to FIGS. 3A-3C, embodiments of the disclosed breakout connector platform (BCP) 300 include additional connectors and/or supporting components. The illustrated embodiment includes a power input connector 302, a multipin "header" connector 308, a clock input connector 310, a fan power output connector 312, baluns 314, a temperature sensor 316, and test points 318. Embodiments can further include a USB connector and controller, in addition to, or instead of, the header connector 308, a voltage sensor, a power supply and/or voltage regulator, a clock signal source, and/or an analog-to-digital and/or a digital-to-analog converter (ADC/DAC). Some embodiments further include a field programmable gate array (FPGA) and/or a microprocessor and memory, thereby enabling the assembled BCP kit to function as a fully independent system.

With reference to FIGS. 6A-6D, various embodiments of the BCP kit further include a "compartment cover" 600 that extends over the DP-chip 120 and provides RF shielding and/or cooling to the DP-chip 120. In the illustrated embodiment, the interposer circuit card 202 itself serves as the "fourth wall" of the compartment formed with the compartment cover 600. In particular, a ground plane included in the interposer circuit card 202 forms an electrical connection with an RF gasket 606 of the compartment cover 600, and serves as the fourth "wall" of the RF shielding provided by the compartment cover 600. With reference to FIG. 4A, in the illustrated embodiment the compartment cover 600 further includes channels 604 formed by isolating dividers 605 that provide RF isolation between the traces and/or coaxial cables that conduct signals between the DP-chip 120 and the breakout connectors 206. In the illustrated embodiment, the compartment cover 600 also includes a thermal interface material (TIM) 602 that is in direct thermal contact with the DP-chip 120, causing the compartment cover 600 to function as a heat sink for the DP-chip 120.

Figure 6A:
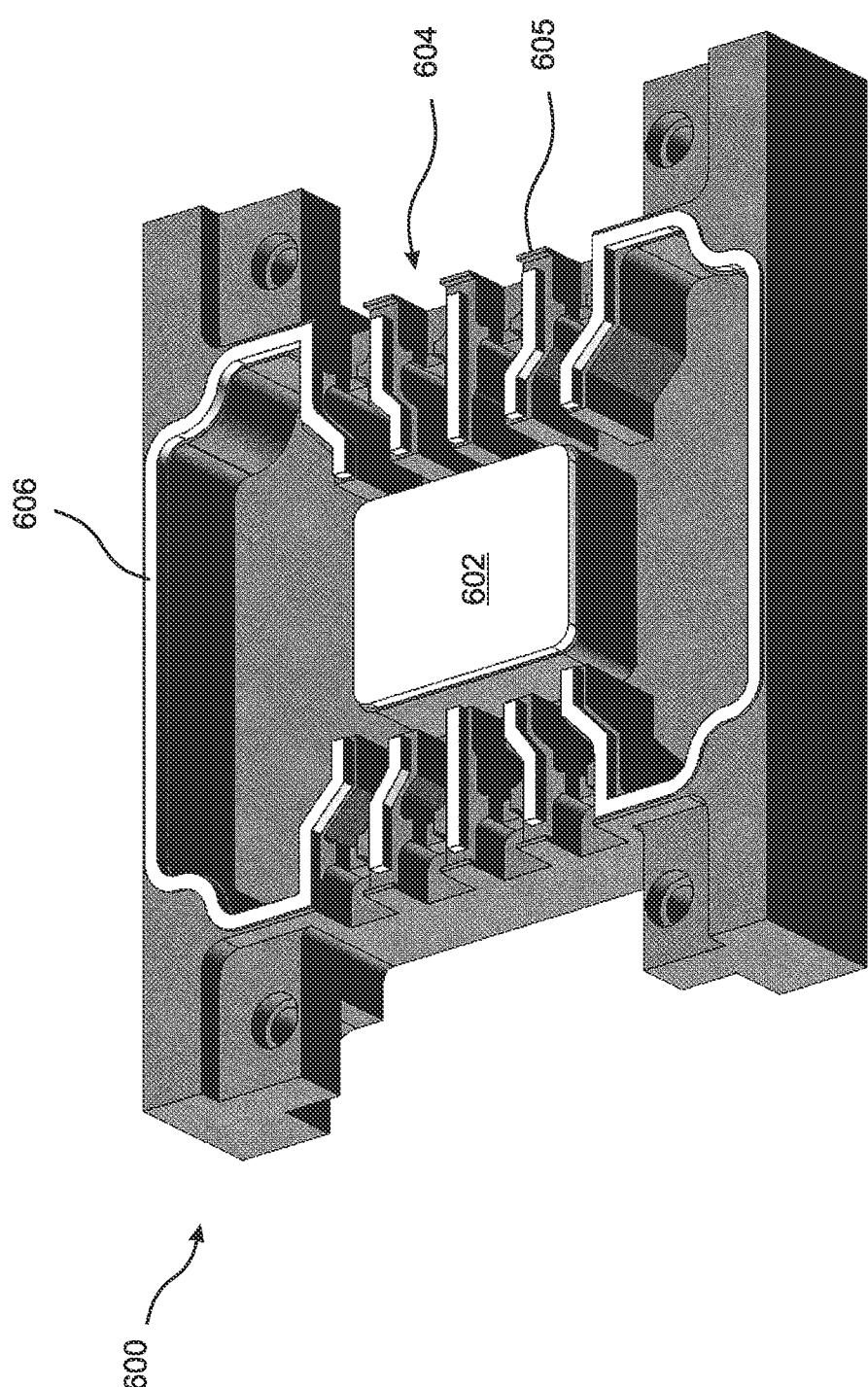
FIG. 6A is a perspective view from below, drawn to scale, of an interposer module compartment cover in a BCP kit embodiment of the present disclosure.
Figure 6B:
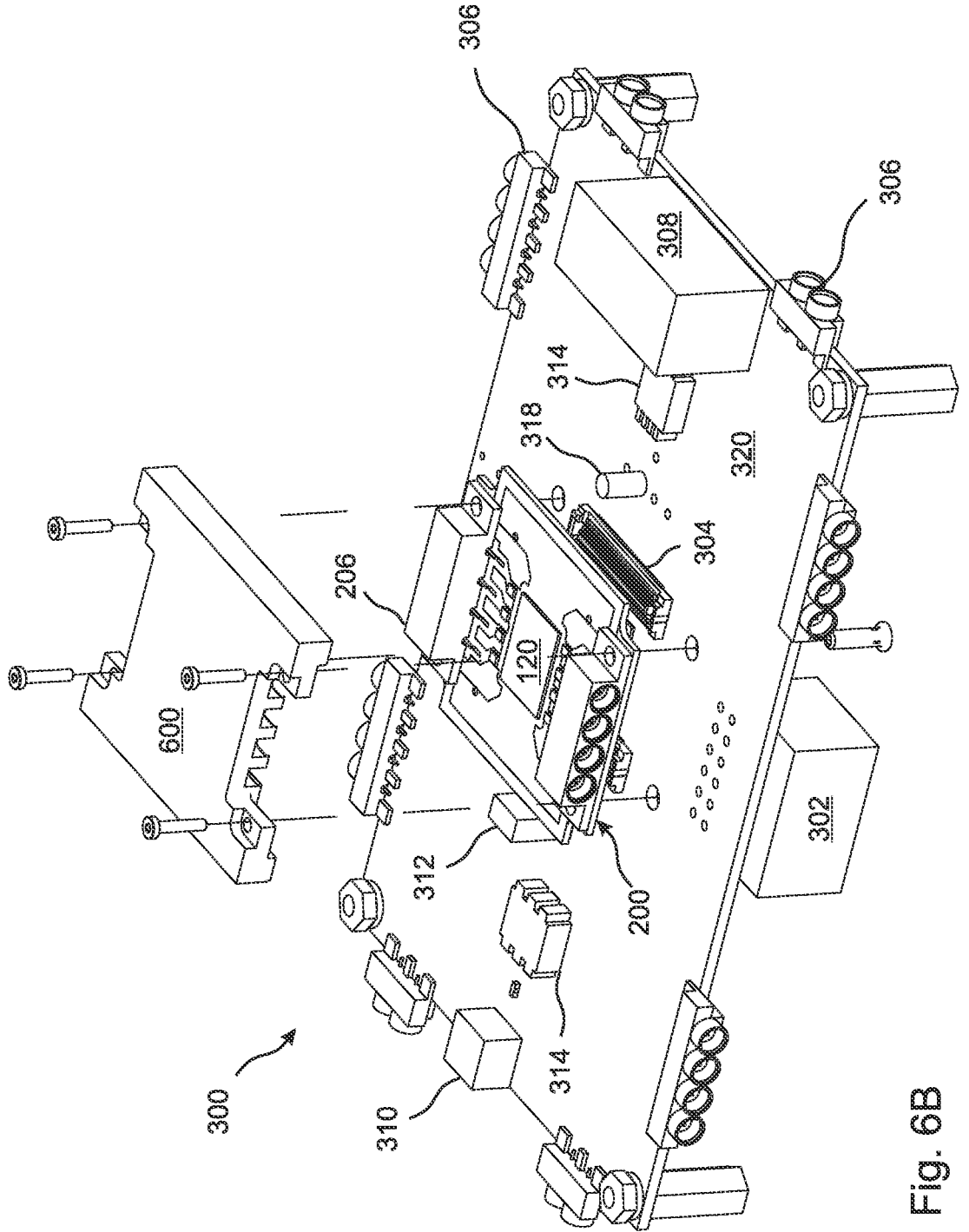
FIG. 6B is an exploded perspective view from above, drawn to scale, of the compartment cover of FIG. 6A positioned over the interposer module of FIG. 2B, which in turn is arranged over the BCP of FIG. 3A.
Figure 6C:
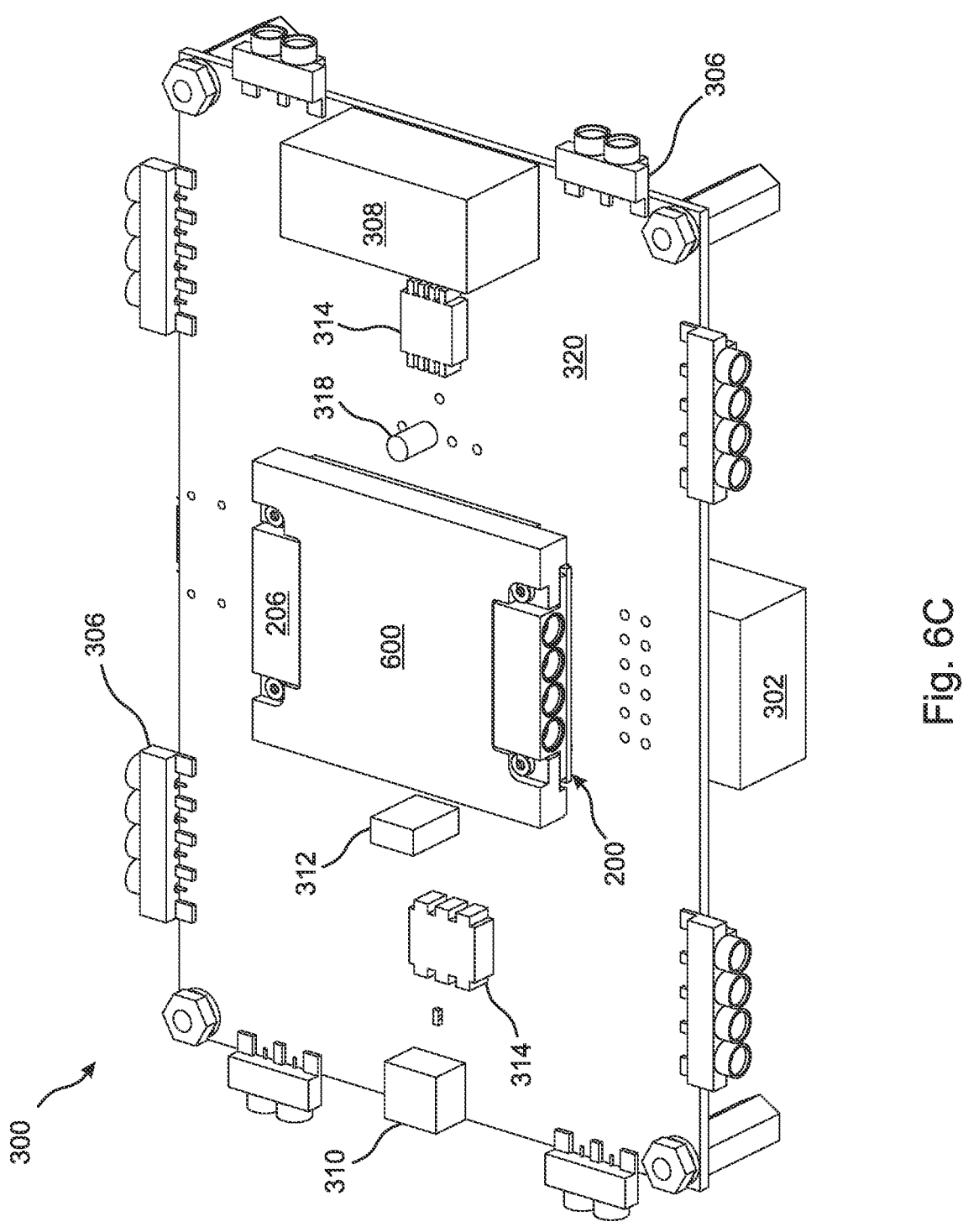
FIG. 6C is a perspective view, drawn to scale, of the compartment cover of FIG. 6A installed over the interposer module of FIG. 2B, which is installed on the BCP of FIG. 3A.
Figure 6D:
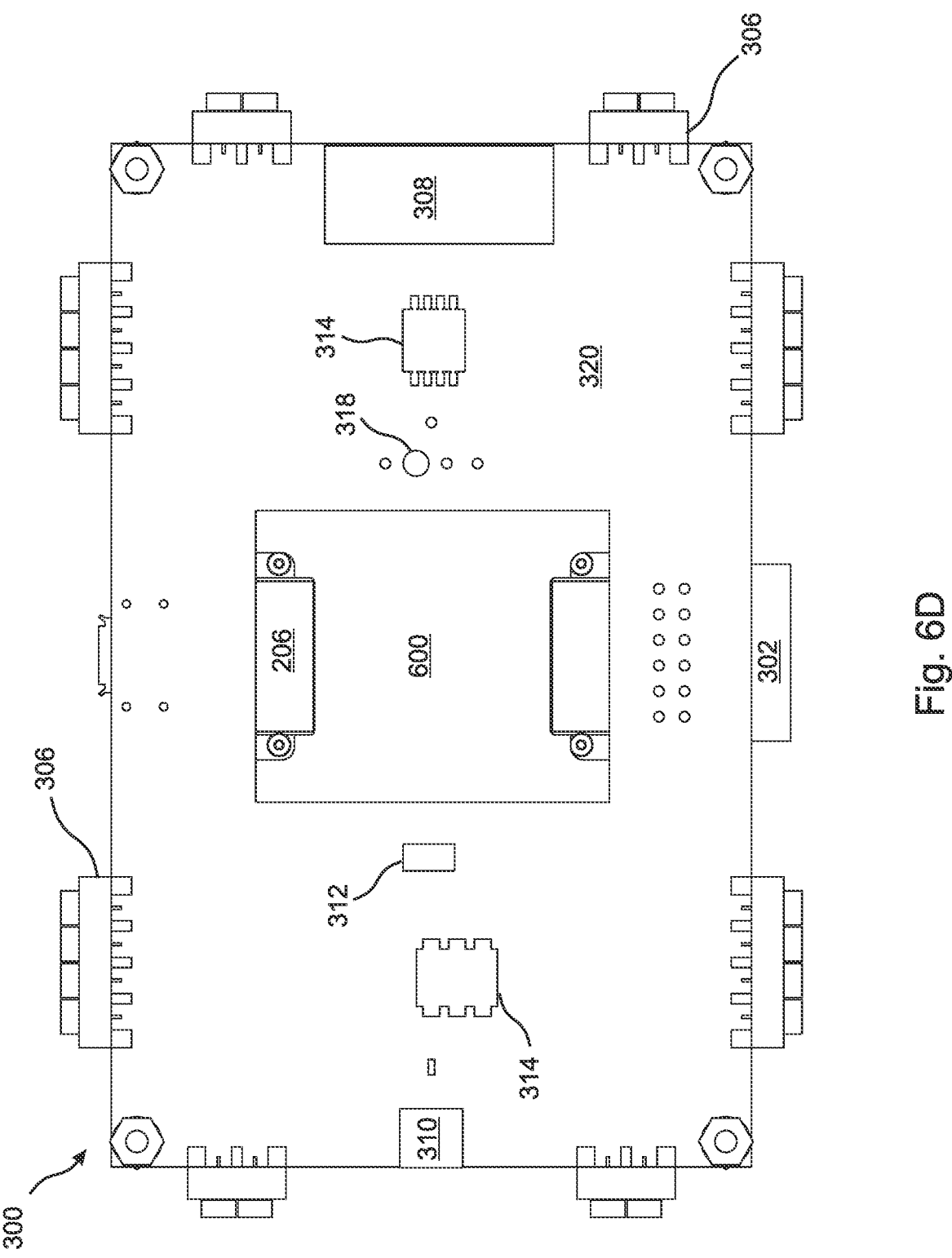
FIG. 6D is a top view, drawn to scale, of the assembled compartment cover, interposer module, and BCP of FIG. 6C.

FIG. 6A is a perspective view from below of a compartment cover 600 in an embodiment of the present disclosure. FIG. 6B is an exploded perspective view showing the interposer module 200 positioned above the BCP mezzanine connectors 304, and further shows the compartment cover 600 positioned above the interposer module 200. FIG. 6C is a perspective view showing the compartment cover 600 installed over the interposer module 200 and the interposer module 200 installed on the BCP 300. FIG. 6D is a top view of the assembled compartment cover 600, interposer module 200, and BCP 300.

Figure 7A:
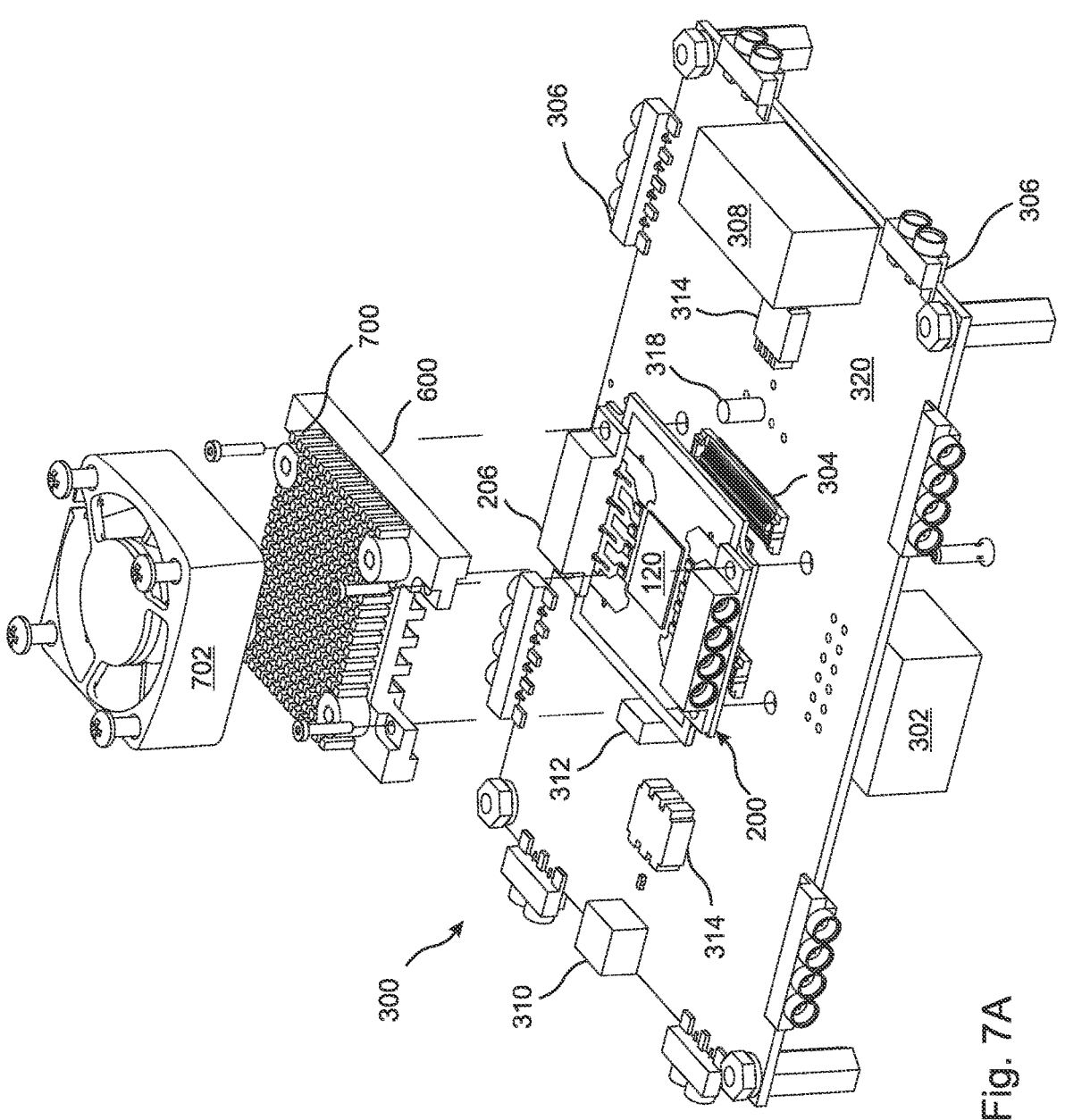
FIG. 7A is an exploded perspective view from above, drawn to scale, of a cooling fan positioned above a compartment cover having cooling finger, the compartment cover being positioned over the interposer module of FIG. 2B, which is arranged over the BCP of FIG. 3A.
Figure 7B:
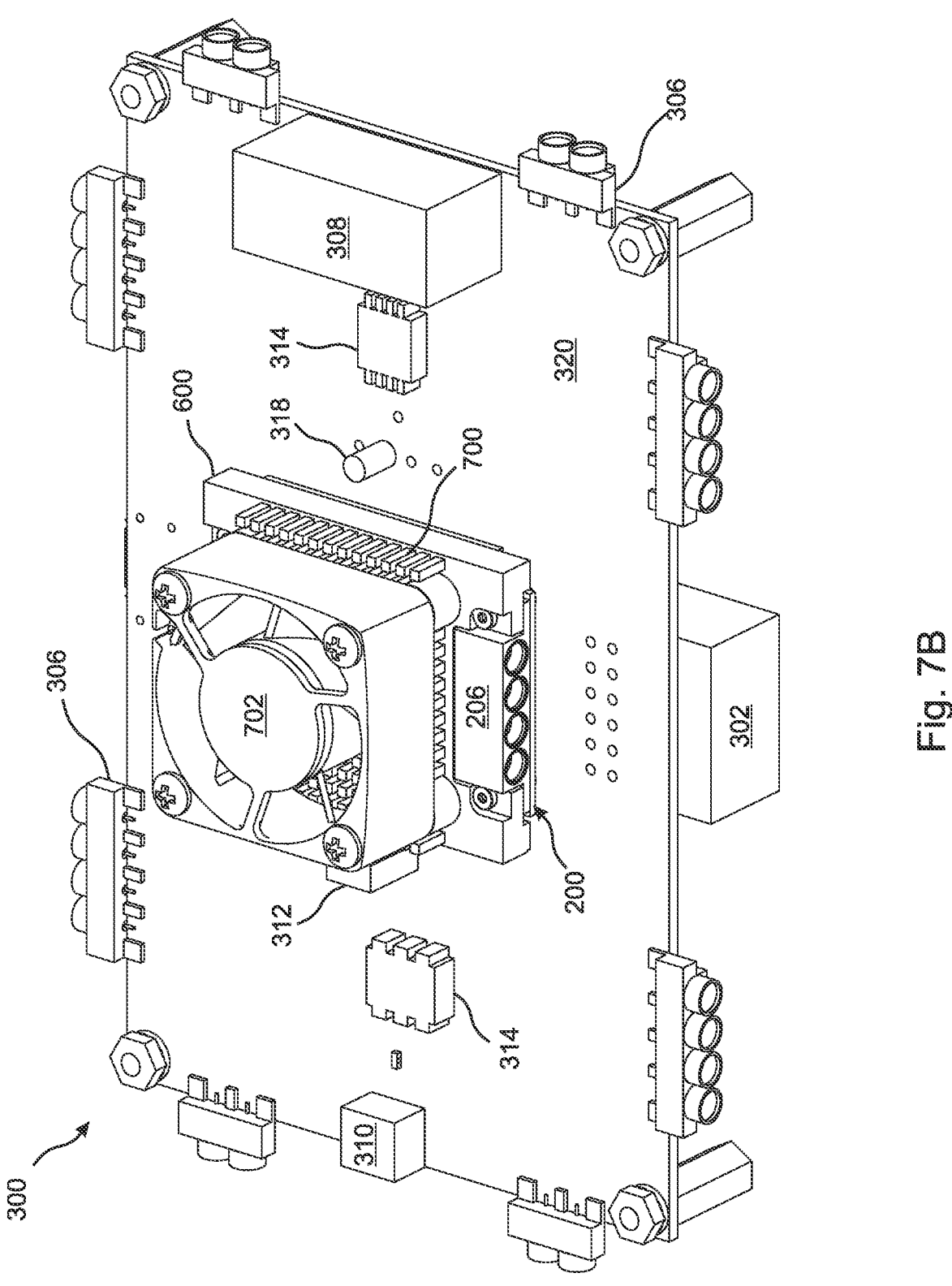
FIG. 7B is a perspective view from above, drawn to scale, of the assembled cooling fan and compartment cover of FIG. 7A installed over the interposer module of FIG. 2B, which is installed on the BCP of FIG. 3A.
Figure 7C:
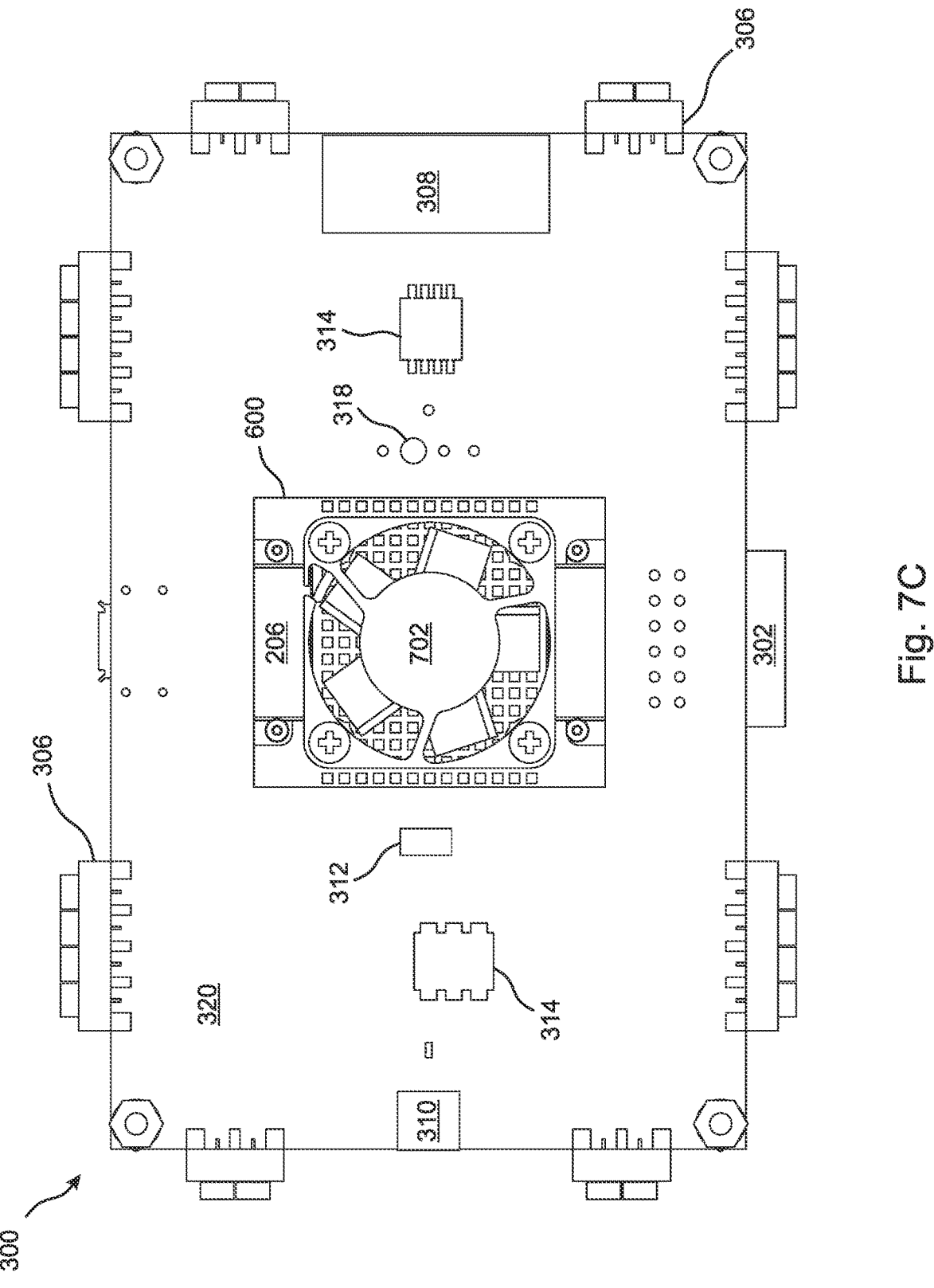
FIG. 7C is a top view, drawn to scale, of the assembled cooling fan, compartment cover, interposer module, and BCP of FIG. 7B.

With reference to FIGS. 7A-7C, embodiments further include cooling fingers 700 extending from the lid of the compartment cover 600, and a fan 702 mounted on top of the compartment cover 600 and configured to circulate air through the cooling fingers 700, thereby actively cooling the DP-chip 120. FIG. 7A is an exploded perspective view of the illustrated embodiment, and FIG. 7B is a perspective view of the assembled embodiment.

Figure 8:
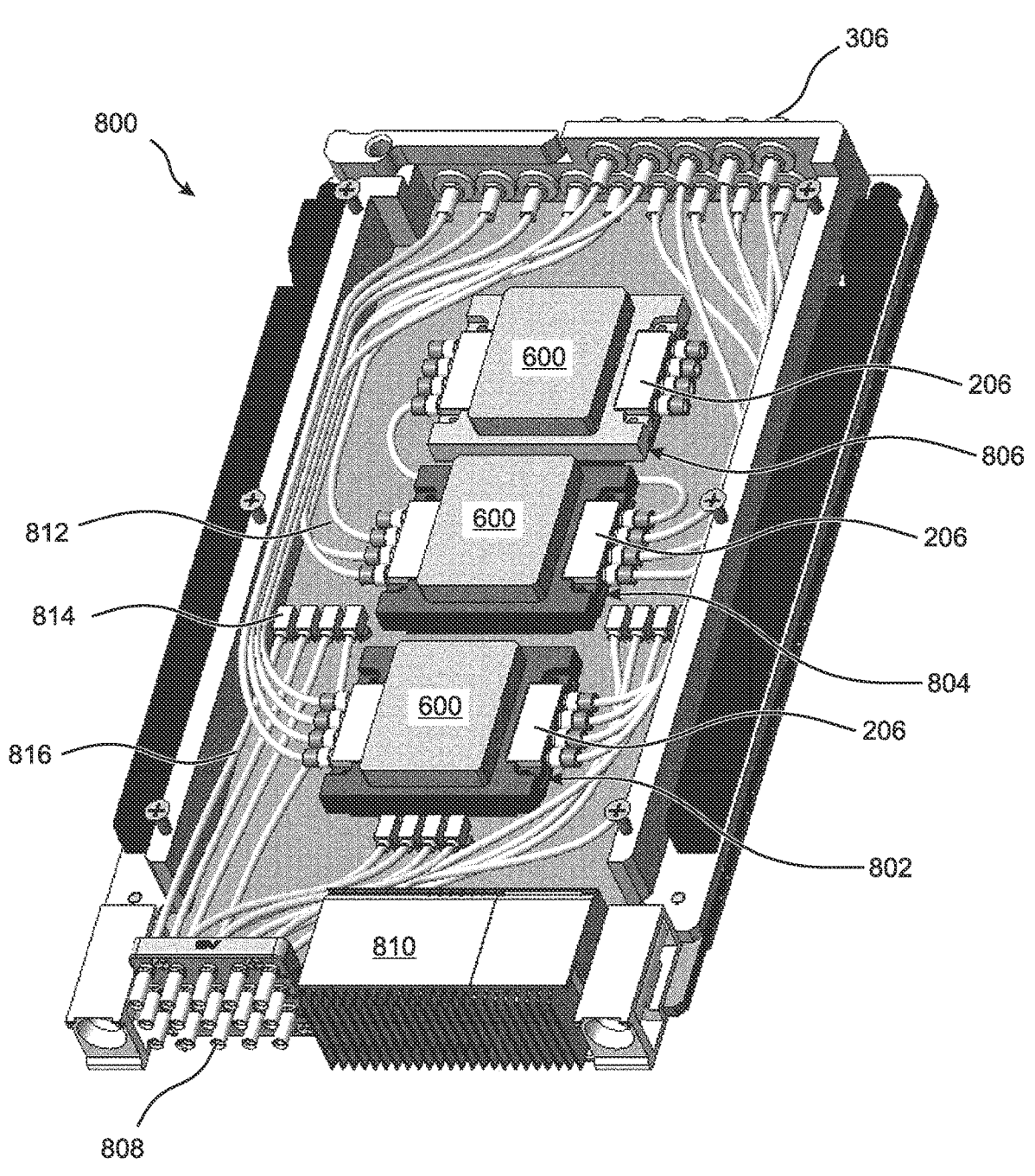
FIG. 8 is a perspective view from above, drawn to scale, of a BCP kit embodiment of the present disclosure in which a plurality of interposer modules are installed on a BCP.

With reference to FIG. 8, in embodiments the BCP 800 is configured to support a plurality of interposer modules. In the illustrated embodiment, the BCP 800 supports three interposer modules 802, 804, 806, which are attached to three pairs of mezzanine connectors 304. The BCP 800 in this embodiment is configured for installation as a card in a chassis (not shown) into which multiple cards can be inserted. A front end of the BCP 800 includes both high frequency RF coaxial connectors 808 and lower frequency signal pins 810 that are configured to interconnect with a backplane of the chassis when the BCP 800 is inserted therein. In the illustrated embodiment, all of the breakout connectors 206 of the first interposer module 802 are interconnected by coaxial cables 812 to the breakout connectors 306 provided on the rear end of the BCP 800, while only selected breakout connectors 206 of the other two interposer modules 804, 806 are interconnected with the BCP breakout connectors 306. Additional high frequency signal connections of the DP-chips 120 are routed from the BCP mezzanine connectors 304 by differential pairs of traces 508 to coaxial connectors 814 installed on the BCP 800, and from thence to the coaxial backplane connectors 808 via additional coaxial cables 816.

Figure 9A:
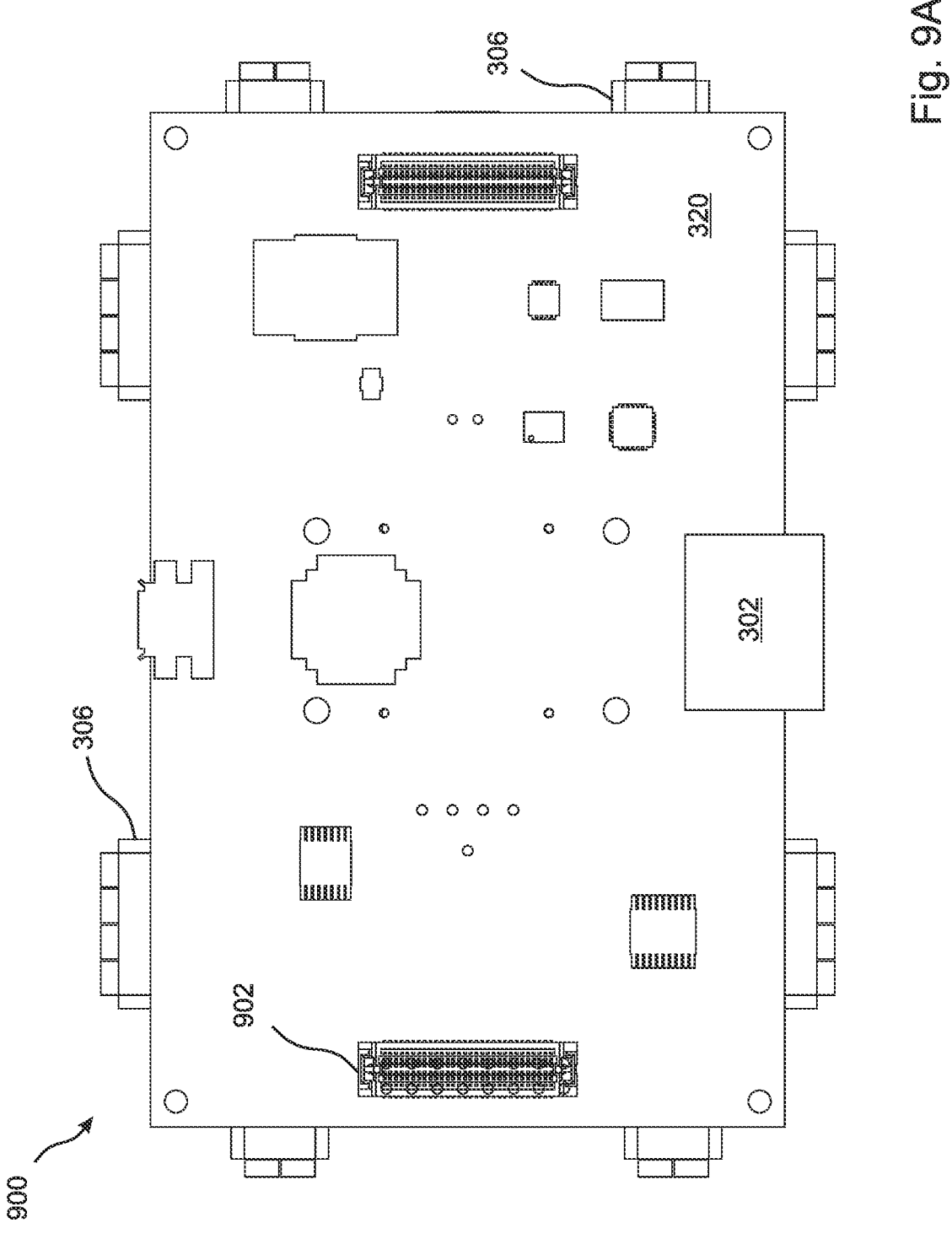
FIG. 9A is a view from below, drawn to scale, of an embodiment of the disclosed BCP that includes secondary mezzanine connectors configured for mating with compatible connectors on an underlying motherboard.
Figure 9B:
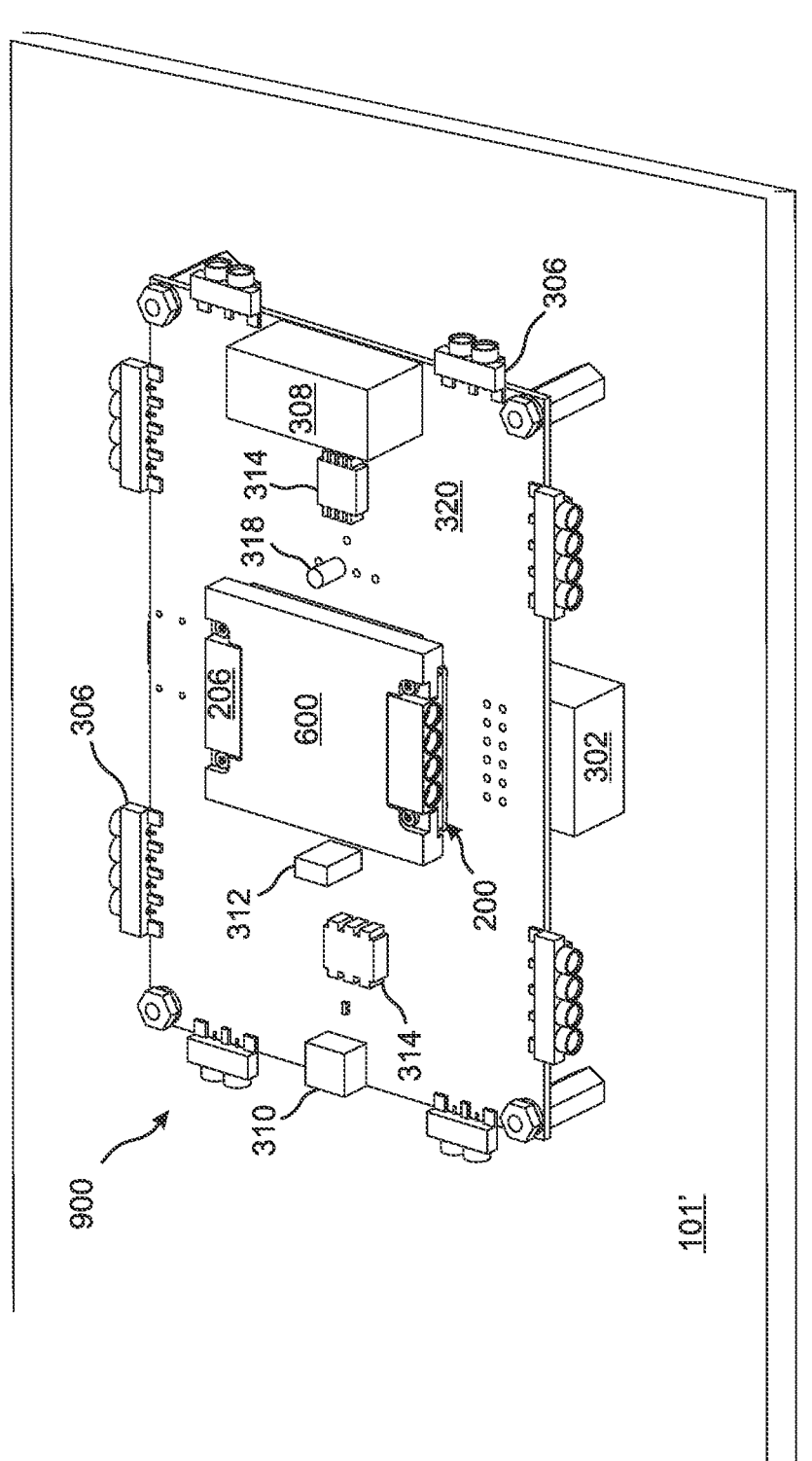
FIG. 9B is a perspective view from above, drawn to scale, of the assembled cooling fan and compartment cover of FIG. 7A installed over the interposer module of FIG. 2B, which is installed on the BCP of FIG. 9A, which is installed on an underlying motherboard.
Figure 9C:
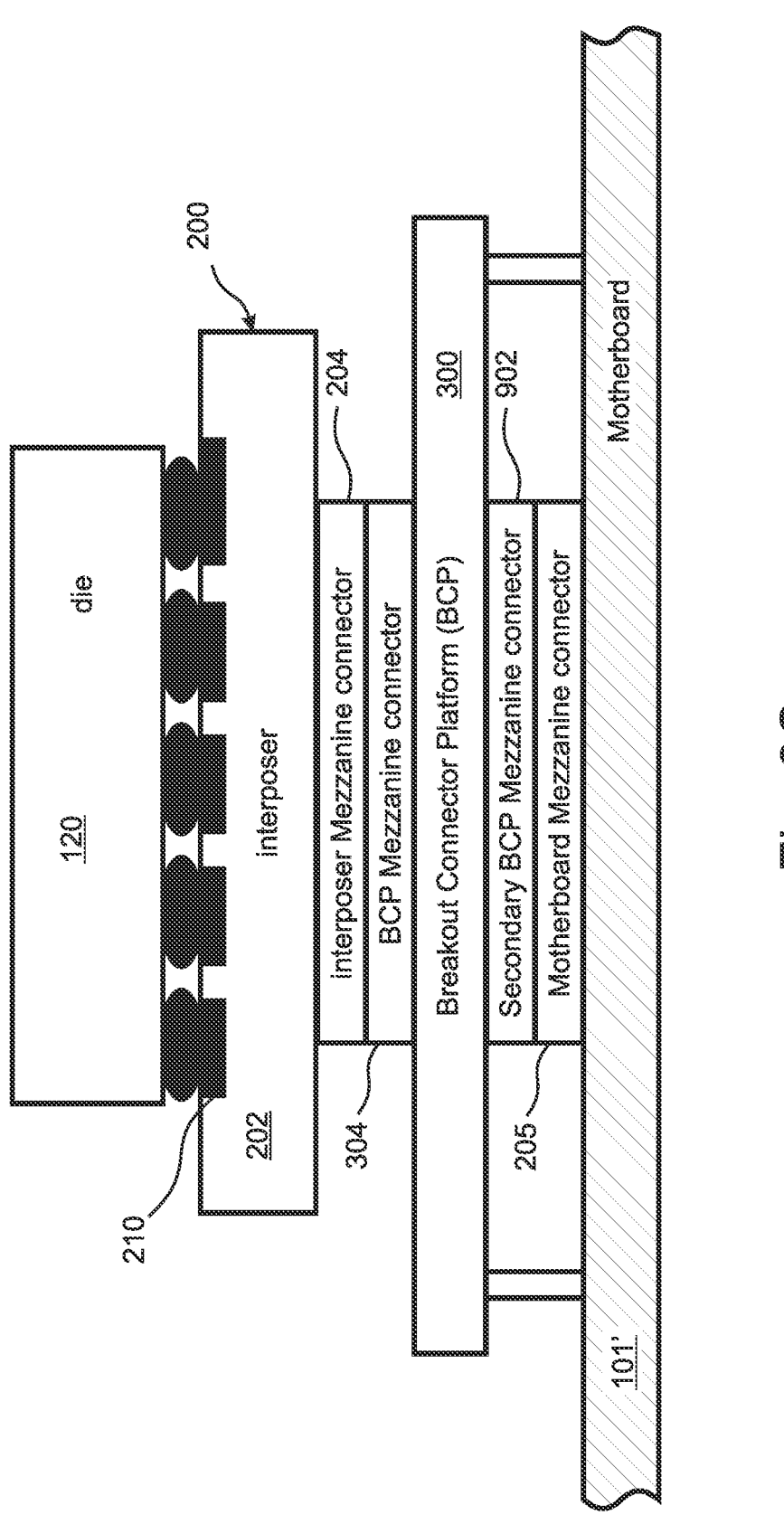
FIG. 9C is a side view of the flip-chip and interposer module of FIG. 2A installed on a BCP, which is installed on an underlying motherboard.

With reference to FIGS. 9A through 9C, in embodiments the BCP 900 further includes one or more secondary BCP mezzanine connectors 902 configured for attachment to compatible one or more secondary motherboard mezzanine connectors provided on an otherwise conventional motherboard 101'. FIG. 9A is a view from below of a BCP embodiment that includes secondary BCP mezzanine connectors 902, and FIG. 9B is a perspective view that illustrates the BCP 900 of FIG. 9A mounted on a motherboard 101'. FIG. 9C is a side view illustrating attachment of a flip-chip 120 to an interposer circuit card 202, of the interposer circuit card 202 to a BCP platform 300 via interposer and BCP mezzanine connectors 204, 304, and of the BCP 300 to an underlying motherboard 101' via secondary and motherboard mezzanine connectors 902, 205.

It will be noted that, for simplicity and clarity of illustration, the drawings and description presented herein are directed mainly to embodiments wherein only one densely pitched (DP) chip 120 is attached to each of the disclosed interposer modules 200. However, it will be understood that the scope of the present disclosure further includes embodiments wherein a plurality of DP-chips 120 are attached to a single interposer module 200, as well as to embodiments in which a plurality of interposer modules 200 are attached to a single BCP 300, and to any combination thereof.

It will be understood from the disclosure presented above that embodiments of the disclosed BCP and BCP kit are not limited to testing of interposer modules and integrated circuits, but can also function as rapid development platforms that can be implemented as finished designs after testing is completed.

The foregoing description of the embodiments of the disclosure has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the disclosure to the precise form disclosed. Many modifications and variations are possible in light of this disclosure.

Although the present application is shown in a limited number of forms, the scope of the disclosure is not limited to just these forms, but is amenable to various changes and modifications. The present application does not explicitly recite all possible combinations of features that fall within the scope of the disclosure. The features disclosed herein for the various embodiments can generally be interchanged and combined into any combinations that are not self-contradictory without departing from the scope of the disclosure. In particular, the limitations presented in dependent claims below can be combined with their corresponding independent claims in any number and in any order without departing from the scope of this disclosure, unless the dependent claims are logically incompatible with each other.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone may be utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments. As such, one aspect or embodiment of the present disclosure may be a computer program product including least one non-transitory computer readable storage medium in operative communication with a processor, the storage medium having instructions stored thereon that, when executed by the processor, implement a method or process described herein, wherein the instructions comprise the steps to perform the method(s) or process(es) detailed herein.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software, and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

While components of the present disclosure are described herein in relation to each other, it is possible for one of the components disclosed herein to include inventive subject matter, if claimed alone or used alone. In keeping with the above example, if the disclosed embodiments teach the features of components A and B, then there may be inventive subject matter in the combination of A and B, A alone, or B alone, unless otherwise stated herein.

As used herein in the specification and in the claims, the term "effecting" or a phrase or claim element beginning with the term "effecting" should be understood to mean to cause something to happen or to bring something about. For example, effecting an event to occur may be caused by actions of a first party even though a second party actually performed the event or had the event occur to the second party. Stated otherwise, effecting refers to one party giving another party the tools, objects, or resources to cause an event to occur. Thus, in this example a claim element of "effecting an event to occur" would mean that a first party is giving a second party the tools or resources needed for the second party to perform the event, however the affirmative single action is the responsibility of the first party to provide the tools or resources to cause said event to occur.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc.

Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

To the extent that the present disclosure has utilized the term "invention" in various titles or sections of this specification, this term was included as required by the formatting requirements of word document submissions pursuant the guidelines/requirements of the United States Patent and Trademark Office and shall not, in any manner, be considered a disavowal of any subject matter.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

What is claimed is:

1. A breakout connector platform (BCP) for signal intercommunication with an integrated circuit via an interposer module, the BCP comprising:
    a BCP circuit card having at least one BCP breakout connector installed thereupon;
    at least one BCP mezzanine connector extending from an upper surface of the BCP circuit card, each of the BCP mezzanine connectors comprising a plurality of BCP mezzanine connections, the BCP mezzanine connections including a plurality of BCP mezzanine ground connections, at least one BCP mezzanine power connection, and at least one BCP AC connection; and
    a plurality of BCP interconnections comprising a plurality of BCP ground interconnections interconnecting between the plurality of BCP mezzanine ground connections and at least one ground input of the BCP circuit card, at least one BCP power interconnection interconnecting between the at least one BCP mezzanine power connection and at least one power input to the BCP circuit card, and at least one BCP AC interconnection interconnecting between the at least one BCP mezzanine AC connection and the at least one BCP breakout connector.

2. The BCP of claim 1, wherein:
    the at least one BCP breakout connector includes a plurality of BCP breakout connectors,
    the BCP mezzanine AC connections include a plurality of high frequency BCP mezzanine connections, said high frequency BCP mezzanine connections being configured to carry high frequency signals having frequencies above 50 MHz;
    the BCP interconnections include a plurality of high frequency BCP interconnections configured to interconnect between the high frequency BCP mezzanine connections and the BCP breakout connectors;

all of the BCP mezzanine power connections are arranged in power clusters, each power cluster including one or more of the mezzanine power connections arranged in a mutually adjacent configuration, each power cluster being surrounded by one or more of the BCP mezzanine ground connections;

all of the high frequency BCP mezzanine connections are arranged in high frequency clusters of differential pairs of the high frequency BCP mezzanine connections, each of the differential pairs of high frequency BCP mezzanine connections being configured to carry high frequency signals that are equal in magnitude, but opposite in polarity, each of the high frequency clusters being surrounded by one or more of the BCP mezzanine ground connections; and all of the BCP high frequency interconnections are arranged on the BCP circuit card in differential pairs of the BCP high frequency interconnections configured to carry signals that are equal in magnitude, but opposite in polarity.

3. The BCP of claim 1, wherein:

the BCP mezzanine connections include a plurality of BCP mezzanine clock connections, said BCP mezzanine clock connections being configured to communicate clock signals having frequencies between 1 MHz and 50 MHz; and all of the BCP mezzanine clock connections are arranged in differential pairs of the BCP mezzanine clock connections configured to carry signals that are equal in magnitude, but opposite in polarity.

4. The BCP of claim 3, wherein:

the BCP mezzanine connections include at least one BCP mezzanine control connection, said BCP mezzanine control connection being configured to communicate signals having frequencies above zero Hz but below 1 MHz; and all of the BCP mezzanine control connections are arranged in low frequency clusters, each low frequency cluster including either one or more of the BCP mezzanine control connections arranged in a mutually adjacent configuration, one or more of the differential pairs of the BCP mezzanine clock connections arranged in a mutually adjacent configuration, or a combination thereof, each of the low frequency clusters being surrounded by one or more of the BCP mezzanine ground connections.

5. The BCP of claim 1, wherein at least one of the BCP breakout connectors is configured for communicating signals having frequencies up to 10 GHz.

6. The BCP of claim 1, further comprising a multipin header connector mounted to the BCP circuit card and configured for communicating signals with external devices.

7. The BCP of claim 1, further comprising a USB connector and an associated USB controller, the USB connector and controller both being mounted to the BCP circuit card and being configured for communicating signals with external devices.

8. The BCP of claim 1, further comprising at least one balun mounted to the BCP circuit card and configured for interconverting signals between a differential pair of signals and a signal referenced to ground.

9. The BCP of claim 1, further comprising at least one of:

a temperature sensor mounted to the BCP circuit card;

a test point provided on the BCP circuit card;

a power supply mounted to the BCP circuit card;

a voltage sensor mounted to the BCP circuit card;

a voltage regulator mounted to the BCP circuit card;

an analog-to-digital converter mounted to the BCP circuit card;

a digital-to-analog converter mounted to the BCP circuit card;

a field programmable gate array mounted to the BCP circuit card;

a microprocessor mounted to the BCP circuit card; and a memory mounted to the BCP circuit card.

10. An apparatus for signal intercommunication with an integrated circuit, the apparatus comprising:

a first interposer module comprising:

an interposer circuit card having an interconnection array on an upper surface thereof, the interconnection array being configured for interconnection with the integrated circuit, the interconnection array comprising a plurality of ground connection pads, at least one power connection pad, and a plurality of AC connection pads;

at least one interposer mezzanine connector extending from a lower surface of the interposer circuit card, each of the at least one interposer mezzanine connector comprising a plurality of interposer mezzanine connections; and a plurality of interposer interconnections between the interconnection array and the interposer mezzanine connections;

the interposer mezzanine connections including a plurality of interposer mezzanine ground connections interconnected by the interposer interconnections with the plurality of ground connection pads, at least one interposer mezzanine power connection interconnected by the interposer interconnections with the at least one power connection pad, and a plurality of interposer mezzanine AC connections interconnected by the interposer interconnections with the plurality of AC connection pads; and a breakout connector platform (BCP) comprising:

a BCP circuit card having at least one BCP breakout connector installed thereupon;

at least one BCP mezzanine connector extending from an upper surface of the BCP circuit card, the at least one BCP mezzanine connector being compatible for mating with the at least one interposer mezzanine connector, each of the BCP mezzanine connectors comprising a plurality of BCP mezzanine connections, the BCP mezzanine connections including a plurality of BCP mezzanine ground connections configured for interconnection with the plurality of interposer mezzanine ground connections, at least one BCP mezzanine power connection configured for interconnection with the at least one interposer mezzanine power connection, and a plurality of BCP mezzanine AC connections configured for interconnection with the plurality of interposer mezzanine AC connections; and a plurality of BCP interconnections comprising a plurality of BCP ground interconnections interconnecting between the plurality of BCP mezzanine ground connections and at least one ground input of the BCP circuit card, at least one BCP power interconnection interconnecting between the at least one BCP mezzanine power connection and at least one power input to the BCP circuit card, and at least one BCP AC interconnection interconnecting between at least one of the plurality of BCP mezzanine AC connections and the at least one BCP breakout connector.

11. The apparatus of claim 10, wherein:
the interposer AC mezzanine connections include a plurality of high frequency interposer mezzanine connections, wherein said high frequency interposer mezzanine connections are configured to carry high frequency signals having frequencies above 50 MHz;
the BCP AC mezzanine connections include a plurality of high frequency BCP mezzanine connections, wherein said high frequency BCP mezzanine connections are configured to interconnect with the high frequency interposer mezzanine connections;
the at least one BCP breakout connector comprises a plurality of BCP breakout connectors;
the BCP AC interconnections include a plurality of BCP high frequency interconnections, wherein said BCP high frequency interconnections are configured to interconnect between the BCP high frequency mezzanine connections and the BCP breakout connectors;
all of the interposer and BCP mezzanine power connections are arranged in power clusters, each power cluster including one or more of the mezzanine power connections arranged in a mutually adjacent configuration, each power cluster being surrounded by one or more of the interposer or BCP mezzanine ground connections;
all of the interposer and BCP mezzanine high frequency connections are arranged in high frequency clusters of differential pairs of the mezzanine high frequency mezzanine connections, each of the differential pairs of mezzanine high frequency connections being configured to carry signals that are equal in magnitude, but opposite in polarity, each of the high frequency clusters being surrounded by one or more of the interposer or BCP mezzanine ground connections; and
all of the BCP high frequency interconnections are arranged on the BCP circuit card in differential pairs of BCP high frequency interconnections configured to carry signals that are equal in magnitude, but opposite in polarity.

12. The apparatus of claim 10, wherein:
the interposer mezzanine connections include at least one interposer mezzanine clock connection configured to carry clock signals, said clock signals having frequencies between 1 MHz and 50 MHz;
the BCP mezzanine connections include at least one BCP mezzanine clock connection configured for interconnection with the at least one interposer clock connection; and
all of the interposer and BCP mezzanine clock connections are arranged in differential pairs of mezzanine clock connections configured to carry signals that are equal in magnitude, but opposite in polarity.

13. The apparatus of claim 12, further comprising a clock signal source mounted on the BCP circuit card, the BCP interconnections including at least one differential pair of clock interconnections interconnecting between the clock signal source and one of the differential pairs of BCP mezzanine clock connections.

14. The apparatus of claim 12, wherein:
the interposer mezzanine connections include at least one interposer mezzanine control connection, said interposer mezzanine control connection being configured to communicate signals having frequencies above zero Hz but below MHz;
the BCP mezzanine connections include at least one BCP mezzanine control connection configured for interconnection with the at least one interposer mezzanine control connection; and
all of the interposer and BCP mezzanine control connections are arranged in low frequency clusters, each low frequency cluster including either one or more of the mezzanine control connections arranged in a mutually adjacent configuration, one or more of the differential pairs of mezzanine clock connections arranged in a mutually adjacent configuration, or a combination thereof, each of the low frequency clusters being surrounded by one or more of the mezzanine ground connections.

15. The apparatus of claim 10, further comprising:
a compartment cover configured for installation on the interposer circuit card over the integrated circuit, the compartment cover comprising a thermally conductive compartment cover lid and a cooling fan configured to actively circulate air through a plurality of cooling fingers provided on the compartment cover lid; and
a fan power output connector mounted to the BCP circuit card and configured for supplying power to the cooling fan.

16. The apparatus of claim 10, further comprising a second interposer module comprising at least one second interposer mezzanine connector, the at least one BCP mezzanine connector comprising a plurality of BCP mezzanine connectors, at least one of which being configured for mating with the at least one second interposer mezzanine connector of the second interposer module.

17. The apparatus of claim 10, wherein the apparatus is configured for installation as a card in a chassis into which a plurality of cards can be inserted, a front end of the BCP circuit card including at least one backplane connector configured for interconnection with a backplane of the chassis when the apparatus is inserted therein.

18. The apparatus of claim 10, further comprising at least one secondary mezzanine connector extending from a lower surface of the BCP circuit card, the at least one secondary mezzanine connector being configured for mating with at least one compatible motherboard connector provided on an underlying motherboard.

19. The apparatus of claim 10, wherein the connection pads include at least one high frequency connection pad, said high frequency connection pad being configured to carry high frequency signals having frequencies above 50 MHz, and wherein the apparatus further comprises an interposer breakout connector mounted to the interposer circuit card and interconnected by one of the interposer interconnections with one of the high frequency connection pads.

20. The apparatus of claim 19, wherein the interposer breakout connector is configured for communicating signals having frequencies up to 40 GHz.

* * * * *